United States Patent
Endoh et al.

(10) Patent No.: US 11,258,006 B2
(45) Date of Patent: Feb. 22, 2022

(54) MAGNETIC MEMORY ELEMENT, METHOD FOR PRODUCING SAME, AND MAGNETIC MEMORY

(71) Applicant: TOHOKU UNIVERSITY, Miyagi (JP)

(72) Inventors: Tetsuo Endoh, Miyagi (JP); Masaaki Niwa, Miyagi (JP); Hiroaki Honjo, Miyagi (JP); Hideo Sato, Miyagi (JP); Shoji Ikeda, Miyagi (JP); Toshinari Watanabe, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 16/996,559

(22) Filed: Aug. 18, 2020

(65) Prior Publication Data
US 2021/0091304 A1  Mar. 25, 2021

(30) Foreign Application Priority Data
Aug. 23, 2019  (JP) .............................. JP2019-153233

(51) Int. Cl.
*H01L 43/02* (2006.01)
*H01L 27/22* (2006.01)
(Continued)

(52) U.S. Cl.
CPC ............ *H01L 43/02* (2013.01); *G11C 11/161* (2013.01); *G11C 11/1673* (2013.01);
(Continued)

(58) Field of Classification Search
CPC ....... H01L 43/02; H01L 27/228; H01L 43/10; H01L 43/12; H01L 43/08; G11C 11/1675; G11C 11/161; G11C 11/1673
See application file for complete search history.

(56) References Cited

U.S. PATENT DOCUMENTS 8,119,424 B2 * 2/2012 Mather ................. B82Y 10/00
                                                          438/3
8,184,408 B2 * 5/2012 Murakami ............. B82Y 10/00
                                                          360/324.11
(Continued)

FOREIGN PATENT DOCUMENTS

WO      2013153942 A1    10/2013
WO      2018179660 A1    10/2018

OTHER PUBLICATIONS

H. Sato et al., "14ns write speed 128Mb density Embedded STT-MRAM with endurance>1010 and 10yrs retention@85° C using novel low damage MTJ integration process," 2018 IEEE International Electron Devices Meeting (IEDM), San Francisco, CA, 2018, pp. 27.2.1-27.2.4, doi: 10.1109/IEDM.2018.8614606.

*Primary Examiner* — Tri M Hoang
(74) *Attorney, Agent, or Firm* — Fox Rothschild LLP; Robert J. Sacco; Carol E. Thorstad-Forsyth

(57) ABSTRACT

Provided are a magnetic memory element in which an improvement in properties, such as an improvement in coercive properties or a reduction in a leak current, can be attained, a method for producing the same, and a magnetic memory. The magnetic memory element, includes: a columnar stack ST in which a reference layer FX having a fixed magnetization direction, a barrier layer TL including a non-magnetic body, and a recording layer FR having a reversible magnetization direction are stacked in this order; and an insulating film which contains nitrogen and is provided to cover a lateral surface of the columnar stack, in which in one or both of the recording layer and the barrier layer, a nitrogen concentration is $7 \times 10^{30}$ atoms/m² or more in a position of 2 nm inside from an outer circumferential end of the columnar stack.

16 Claims, 13 Drawing Sheets

(51) Int. Cl.
  *H01L 43/10* (2006.01)
  *H01L 43/12* (2006.01)
  *G11C 11/16* (2006.01)

(52) U.S. Cl.
  CPC ........ *G11C 11/1675* (2013.01); *H01L 27/228* (2013.01); *H01L 43/10* (2013.01); *H01L 43/12* (2013.01)

(56) References Cited

U.S. PATENT DOCUMENTS

| | | | | |
|---|---|---|---|---|
| 8,228,643 | B2* | 7/2012 | Yuasa | G11B 5/3906 360/324 |
| 8,264,053 | B2* | 9/2012 | Tsukamoto | G11C 11/161 257/421 |
| 8,472,149 | B2* | 6/2013 | Hara | H01F 10/3272 360/324 |
| 9,028,909 | B2* | 5/2015 | Fukuzawa | B82Y 10/00 427/127 |
| 9,218,977 | B2* | 12/2015 | Won | H01L 21/82345 |
| 10,753,990 | B2* | 8/2020 | Niu | G01R 33/26 |

* cited by examiner

MAGNETIC MEMORY ELEMENT, METHOD FOR PRODUCING SAME, AND MAGNETIC MEMORY

CROSS REFERENCE TO RELATED APPLICATIONS

This application claims priority to Japanese Patent Application No. 2019-153233 filed on Aug. 23, 2019, the contents of which is incorporated herein by reference in its entirety.

TECHNICAL FIELD

The present invention relates to a magnetic memory element, a method for producing the same, and a magnetic memory.

BACKGROUND ART

A magnetic random access memory (MRAM) using a magnetoresistive effect element as a storage element has been developed as a next-generation nonvolatile magnetic memory in which high speed properties and high rewrite tolerance can be obtained. The MRAM, for example, includes a magnetic memory cell having a structure in which a selection transistor and a magnetoresistive effect element are electrically connected in series.

The magnetoresistive effect element has a structure in which a barrier layer (a non-magnetic layer) is interposed between a reference layer (a fixed layer) and a recording layer (a free layer), which are two magnetic layers, and is also referred to as a tunnel magnetoresistance (TMR) element having a magnetic tunnel junction (MTJ). In the reference layer, a magnetization direction is fixed. In the recording layer, it is possible to reverse a magnetization direction by using spin transfer torque (STT) or the like.

A resistance value of the magnetoresistive effect element decreases in a case where the magnetization directions of the reference layer and the recording layer are in a parallel arrangement, and increases in a case where the magnetization directions are in an anti-parallel arrangement. Such two resistance states are assigned to bit information of "0" and "1", and thus, data can be recorded.

In Patent Literature 1, a magnetoresistive effect element and a magnetic memory, including a recording layer that performs perpendicular magnetic recording, are disclosed.

In Patent Literature 2, a magnetoresistive effect element and a magnetic memory are disclosed, and there is description relevant to an effective magnetic anisotropic constant per unit area.

CITATION LIST

Patent Literature

Patent Literature 1: WO 2013/153942
Patent Literature 2: WO 2018/179660

SUMMARY OF INVENTION

Technical Problem

However, in the magnetic memory element described above, in a case where nitrogen (N) is mixed into CoFeB configuring the magnetic layer or MgO configuring the non-magnetic layer, coercive properties may be degraded. In addition, a leak current occurs in the vicinity of an interface between a columnar stack and a protective film, and thus, the properties may be degraded. For this reason, in the magnetic memory element, an improvement in the properties of the magnetic memory element, such as an improvement in the coercive properties or a reduction in the leak current, is required.

Therefore, the invention has been made in consideration of such problems as described above, and an object thereof is to provide a magnetic memory element in which an improvement in properties, such as an improvement in coercive properties or a reduction in a leak current, can be attained, a method for producing the same, and a magnetic memory.

Solution to Problem

A magnetic memory element according to the invention, includes: a columnar stack in which a reference layer having a fixed magnetization direction, a barrier layer including a non-magnetic body, and a recording layer having a reversible magnetization direction are stacked in this order; and an insulating film which contains nitrogen and is provided to cover a lateral surface of the columnar stack, in which in one or both of the recording layer and the barrier layer, a nitrogen concentration is $4 \times 10^{29}$ atoms/m$^2$ or less in a position of 13 nm inside from an outer circumferential end of the columnar stack.

A magnetic memory according to the invention, includes: the magnetic memory element described above; a write unit writing data in the magnetic memory element by applying a write current to the magnetic memory element; and a read unit reading the data written in the magnetic memory element by applying a read current that passes through the barrier layer, and by detecting the read current that has passed through the barrier layer.

A method for producing a magnetic memory element according to the invention, includes: a step of forming a stack in which a reference layer having a fixed magnetization direction, a barrier layer including a non-magnetic body, and a recording layer having a reversible magnetization direction are stacked in this order; a step of forming a columnar stack by processing the stack into the shape of a column; and a step of forming an insulating film which contains nitrogen and covers a lateral surface of the columnar stack, in which in the step of forming the insulating film, the insulating film is formed such that in one or both of the recording layer and the barrier layer, a nitrogen concentration is $4 \times 10^{29}$ atoms/m$^2$ or less in a position of 13 nm inside from an outer circumferential end of the columnar stack.

A magnetic memory element according to the invention, includes: a columnar stack in which a reference layer having a fixed magnetization direction, a barrier layer including a non-magnetic body, and a recording layer having a reversible magnetization direction are stacked in this order; and an insulating film which contains nitrogen and is provided to cover a lateral surface of the columnar stack, in which in one or both of the recording layer and the barrier layer, a nitrogen concentration is $7 \times 10^{30}$ atoms/m$^2$ or more in a position of 2 nm inside from an outer circumferential end of the columnar stack.

A magnetic memory according to the invention, includes: the magnetic memory element described above; a write unit writing data in the magnetic memory element by applying a write current to the magnetic memory element; and a read unit reading the data written in the magnetic memory element by applying a read current that passes through the barrier layer, and by detecting the read current that has passed through the barrier layer.

A method for producing a magnetic memory element according to the invention, includes: a step of forming a stack in which a reference layer having a fixed magnetization direction, a barrier layer including a non-magnetic body, and a recording layer having a reversible magnetization direction are stacked in this order; a step of forming a columnar stack by processing the stack into the shape of a column; and a step of forming an insulating film which contains nitrogen and covers a lateral surface of the columnar stack, in which in the step of forming the insulating film, the insulating film is formed such that in one or both of the recording layer and the barrier layer, a nitrogen concentration is $7 \times 10^{30}$ atoms/m$^2$ or more in a position of 2 nm inside from an outer circumferential end of the columnar stack.

Advantageous Effects of Invention

According to the invention, in one or both of the recording layer and the barrier layer, the nitrogen concentration is $4 \times 10^{29}$ atoms/m$^2$ or less in the position of 13 nm inside from the outer circumferential end of the columnar stack, and thus, it is possible to improve the coercive properties of the magnetic memory element, and to improve the properties of the magnetic memory element.

According to the invention, in one or both of the recording layer and the barrier layer, the nitrogen concentration is $7 \times 10^{30}$ atoms/m$^2$ or more in the position of 2 nm inside from the outer circumferential end of the columnar stack, and thus, it is possible to reduce a leak current in the vicinity of the interface between the columnar stack and the insulating film, and to improve the properties of the magnetic memory element.

Figure 1:
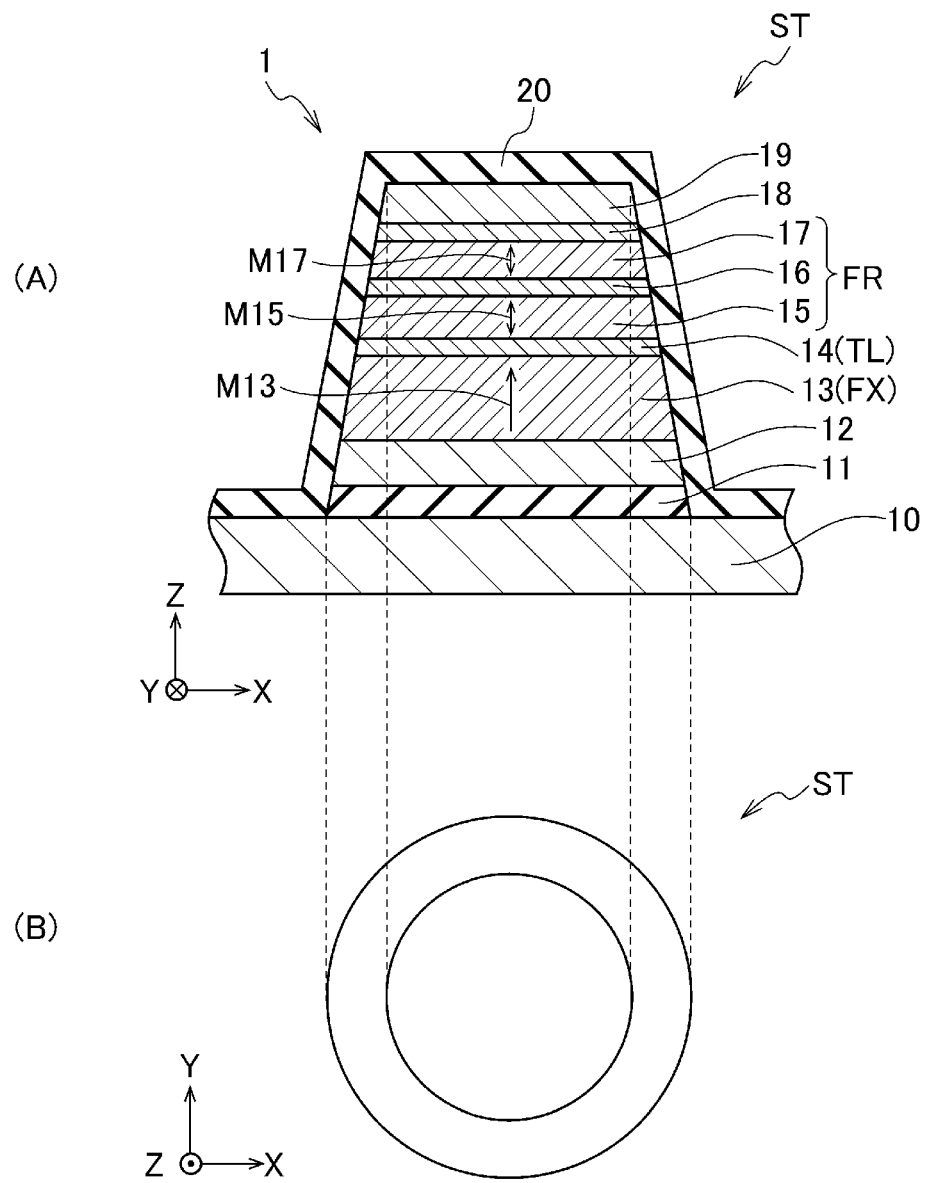
FIG. 1 shows (A): a sectional view of a magnetic memory element of a first embodiment of the invention, and (B): a schematic view of an upper surface of a columnar stack configuring the magnetic memory element of (A) of FIG. 1.

DESCRIPTION OF EMBODIMENTS (1) First Embodiment (1-1) Overall Configuration of Magnetic Memory Element of First Embodiment A magnetic memory element 1 of an embodiment of the invention will be described with reference to (A) and (B) of FIG. 1. Hereinafter, "(A) of FIG. 1" is sometimes referred to as "FIG. 1(A)". Such an expression is applicable to (A) to (G) of FIG. 1, 2, 7, 8, 9 or 14.

FIG. 1(A) is a sectional view of the magnetic memory element 1. FIG. 1(B) is a schematic view of an upper surface of a columnar stack configuring the magnetic memory element of FIG. 1(A). The magnetic memory element 1 includes a columnar stack ST stacked in a Z direction, on a main surface of a substrate 10 (a surface parallel to an XY surface).

The columnar stack ST has a structure in which a first insulating film 11, a first conductive layer 12, a first ferromagnetic layer 13, a first non-magnetic layer 14, a second ferromagnetic layer 15, a non-magnetic coupling layer 16, a third ferromagnetic layer 17, a second non-magnetic layer 18, and a second conductive layer 19 are stacked in this order from the substrate 10 side. In addition, a second insulating film 20 that is a protective film and covers a lateral surface of the columnar stack ST is provided. The second insulating film 20 is provided adjacent to a top portion of the columnar stack ST and the substrate 10 in a portion in which the columnar stack ST is not provided. Note that, in FIG. 1(B), the second insulating film 20 is not illustrated.

In the magnetic memory element 1, a reference layer FX includes the first ferromagnetic layer 13. A barrier layer TL that is a tunnel junction layer includes the first non-magnetic layer 14. In addition, a recording layer FR includes a stack of the second ferromagnetic layer 15, the non-magnetic coupling layer 16, and the third ferromagnetic layer 17. The magnetic memory element has a magnetic tunnel junction (MTJ) including the reference layer FX, the barrier layer TL, and the recording layer FR. A magnetization direction M13 of the first ferromagnetic layer 13 of the reference layer FX, a magnetization direction M15 of the second ferromagnetic layer 15 of the recording layer FR, and a magnetization direction M17 of the third ferromagnetic layer 17 are a direction perpendicular to a film surface (the Z direction). The magnetic memory element 1 of this embodiment is a perpendicular magnetization type magnetic memory element. The columnar stack ST is a stack having such an MTJ, and the columnar stack ST may be referred to as an MTJ (element).

For example, a silicon (Si) substrate, a magnesium oxide (MgO) substrate, or the like is used as the substrate 10. Substrates of other materials may be used. Specifically, the substrate 10 is a Si substrate of 300 mm$\phi$.

The first insulating film 11, for example, includes an insulating body such as silicon oxide ($SiO_2$). The first insulating film 11 may have a film thickness that is capable of insulating between the magnetic memory element 1 and the substrate 10.

The first conductive layer 12 is a layer to be an electrode that is connected to the magnetic memory element 1. A material that has small surface roughness and is capable of attaining <100> orientation in a film surface direction (the Z direction) in the first ferromagnetic layer 13 is preferable as the first conductive layer 12. For example, tantalum (Ta), and a stack film of Ta and ruthenium (Ru) can be used.

In the first ferromagnetic layer 13, the magnetization direction M13 is fixed in the direction perpendicular to the film surface (the Z direction). For example, the first ferromagnetic layer 13 includes a ferromagnetic body that contains at least one of iron (Fe), cobalt (Co), and nickel (Ni), and contains at least one of boron (B), carbon (C), N, oxygen (O), fluorine (F), Si, aluminum (Al), phosphorus (P), and sulfur (S).

Specifically, CoFeB can be preferably used. In addition, the first ferromagnetic layer 13 may be a multi-layer film or an alloy film, and a perpendicular magnetic anisotropic material such as a stack of Co and platinum (Pt) or palladium (Pd), a stack of Ni and Pt or Pd, a stack of Co and Ru, a FePt alloy, and a terbium (Tb)CoFe alloy can be used. The first ferromagnetic layer 13, for example, can be Co—Pt Stack/ Co/Ru/Co—Pt Stack/Co/Ta or tungsten (W)/CoFeB from the first conductive layer 12 side.

The first non-magnetic layer 14 is the barrier layer TL that is interposed between the reference layer FX and the recording layer FR. For example, the first non-magnetic layer 14 includes a non-magnetic body containing at least one of N, O, and C. Specifically, the first non-magnetic layer 14 contains a compound containing oxygen (O), such as MgO, aluminum oxide ($Al_2O_3$), and $SiO_2$. A material in which a magnetoresistance change rate increases by a combination of the first ferromagnetic layer 13 and the second ferromagnetic layer 15 and interface magnetic anisotropy is exhibited is preferable as the first non-magnetic layer 14.

In the second ferromagnetic layer 15, the magnetization direction M15 is the direction perpendicular to the film surface (the Z direction), and the magnetization direction can be reversed by a spin transfer. For example, the second ferromagnetic layer 15 includes a ferromagnetic body that contains at least one of Fe, Co, and Ni, and contains at least one of B, C, N, O, F, Si, Al, P, and S. Specifically, CoFeB can be preferably used. In a case where the composition of CoFeB is represented by $(Co_{100-X}Fe_X)_{100-Y}B_Y$, it is preferable that Y is $15 \le Y \le 25$ in an atomic number ratio. In addition, it is preferable that X is $20 \le X$ in an atomic number ratio.

The non-magnetic coupling layer 16 contains a metal material containing at least one of Ta, hafnium (Hf), W, zirconium (Zr), niobium (Nb), molybdenum (Mo), and titanium (Ti). In particular, a metal material containing Ta is preferable, and in this case, an additive material such as B or C is absorbed in the non-magnetic coupling layer 16 from the second ferromagnetic layer 15 and the third ferromagnetic layer 17 by performing a heat treatment, and thus, the crystallization of the second ferromagnetic layer 15 and the third ferromagnetic layer can be accelerated. In addition, the non-magnetic coupling layer 16 does not weaken a perpendicular magnetic anisotropic energy density of the second ferromagnetic layer 15 and the third ferromagnetic layer 17. It is preferable that a film thickness of the non-magnetic coupling layer 16 is 0.2 nm or more and 1.0 nm or less. In particular, it is preferable that the film thickness of the non-magnetic coupling layer 16 is 0.2 nm or more and 0.6 nm or less. In a case where the film thickness of the non-magnetic coupling layer 16 is excessively thin, an effect of absorbing the additive element from the second ferromagnetic layer 15 and the third ferromagnetic layer 17 is not obtained, and it is difficult for an easy axis of magnetization of the second ferromagnetic layer 15 and the third ferromagnetic layer 17 to be directed toward a perpendicular direction. On the other hand, in a case where the film thickness of the non-magnetic coupling layer 16 is excessively thick, the second ferromagnetic layer 15 and the third ferromagnetic layer 17 independently act, and an effect of improving thermal stability is not obtained. Accordingly, an upper limit and a lower limit of the film thickness of the non-magnetic coupling layer are determined.

As with the second ferromagnetic layer 15, in the third ferromagnetic layer 17, the magnetization direction M17 is in the direction perpendicular to the film surface (the Z direction), and the magnetization direction M17 is reversed in accordance with the reverse of the magnetization direction M15 of the second ferromagnetic layer 15 due to a spin transfer. The third ferromagnetic layer 17 includes the same ferromagnetic body as that of the second ferromagnetic layer 15. Specifically, CoFeB can be preferably used.

As described above, the recording layer FR includes the second ferromagnetic layer 15, the non-magnetic coupling layer 16, and the third ferromagnetic layer 17. The magnetization direction M13 of the first ferromagnetic layer 13 is fixed in the direction perpendicular to the film surface (in FIG. 1, a +Z direction). On the other hand, the magnetization direction M15 of the second ferromagnetic layer 15 and the magnetization direction M17 of the third ferromagnetic layer 17 are the direction perpendicular to the film surface, and the magnetization direction can be reversed. In addition, the magnetization direction M15 of the second ferromagnetic layer 15 and the magnetization direction M17 of the third ferromagnetic layer 17 are the same direction. The recording layer FR has the multi-layer structure described above, and thus, it is possible to increase the film thickness of the recording layer FR while maintaining perpendicular magnetization, and to improve a thermal stability index of the magnetic memory element. In this embodiment, the recording layer FR includes two ferromagnetic layers of the second ferromagnetic layer 15 and the third ferromagnetic layer 17, and the non-magnetic coupling layer 16 is provided between two ferromagnetic layers (the second ferromagnetic layer 15 and the third ferromagnetic layer 17), but the recording layer FR is not limited to such a layer configuration. The recording layer FR may have a multi-layer stack including a plurality of ferromagnetic layers and at least one non-magnetic coupling layer, in which the ferromagnetic layer and the non-magnetic coupling layer are alternately stacked.

It is preferable that a total film thickness of the second ferromagnetic layer 15 and the third ferromagnetic layer 17 is 0.8 nm or more and 60 nm or less. Regarding a lower limit of the total film thickness of the second ferromagnetic layer 15 and the third ferromagnetic layer 17, the total film thickness may be minimized insofar as the perpendicular direction is the easy axis of magnetization in the second ferromagnetic layer 15 and the third ferromagnetic layer 17, and the lower limit of the film thickness is theoretically close to 0 without any limit. However, in actuality, in a case where the film thickness decreases, the second ferromagnetic layer 15 and the third ferromagnetic layer 17 gradually paramagnetically act. The transition of the film thickness from ferromagnetic properties to paramagnetic properties strongly depends on a formation condition or an annealing condition of the thin film, and the film thickness is approximately 0.4 nm or more and 0.9 nm or less. For this reason, it is preferable that the total film thickness of the second ferromagnetic layer 15 and the third ferromagnetic layer 17 is 0.8 nm or more. In addition, in order to increase thermal stability, operation stability, and producibility, it is preferable to increase the total film thickness of the ferromagnetic layers, and for this reason, it is preferable that the total film thickness of the second ferromagnetic layer 15 and the third ferromagnetic layer 17 is 2 nm or more.

The columnar stack ST includes a protective layer (the second non-magnetic layer 18) that is provided on the surface of the recording layer FR on a side opposite to the barrier layer TL. The protective layer includes the second non-magnetic layer 18 including a non-magnetic body containing O. The second non-magnetic layer 18 causes the interface magnetic anisotropy on the interface with respect to the third ferromagnetic layer 17 in the recording layer FR such that the magnetization direction M17 of the third ferromagnetic layer 17 is directed toward the direction perpendicular to the film surface. Specifically, the second non-magnetic layer 18 contains a compound containing oxygen (O), such as MgO, $Al_2O_3$, and $SiO_2$. A film thickness of the second non-magnetic layer 18, for example, is 0.5 nm or more and 2 nm or less, and is preferably less than a film thickness of the first non-magnetic layer 14. A magnetoresistive effect is used at the time of reading information from the magnetic memory element of this embodiment. The first non-magnetic layer affects a resistance value of the magnetoresistive effect. Accordingly, it is preferable that the film thickness of the first non-magnetic layer 14 is a film thickness in which excellent read properties are obtained. For example, in the case of using MgO in the first non-magnetic layer 14, tunnel resistance thereof is exponentially changed with respect to a film thickness of an MgO film. In order to obtain excellent read properties, the tunnel resistance is designed to be approximately 0.5 kΩ or more and 100 kΩ or less. The film thickness of the MgO film in which such tunnel resistance is obtained depends on the size of the element, and is approximately 0.5 nm or more and 2 nm or less. In addition, the second non-magnetic layer 18 may have a film thickness in which perpendicular magnetic anisotropy can be applied to the third ferromagnetic layer 17, and in the case of using MgO as the second non-magnetic layer 18, a film thickness of 0.5 nm or more can be attained.

The second conductive layer 19 is a layer to be an electrode that is connected to the magnetic memory element 1. For example, a stack film of Ta, Ta, and Ru, Ti, and the like can be used.

The second insulating film 20 covers the lateral surface of the columnar stack ST and is formed on the entire surface of the columnar stack ST and the substrate 10. The second insulating film 20 is a protective film that protects the columnar stack ST. The second insulating film 20 contains an insulating body containing nitrogen, and for example, silicon nitride (SiN) is preferably used. In order to sufficiently obtain an effect of protecting the columnar stack ST, it is preferable that a film thickness of the second insulating film 20 is 5 nm or more. An upper limit of the film thickness of the second insulating film 20 is not particularly limited, and for example, is 100 nm.

Next, an effective magnetic anisotropic constant will be described. In a coordinate in which an X axis and a Y axis are in the plane and a Z axis is in a direction perpendicular to the X-Y plane, a product $K_{eff}t$ (hereinafter, $K_{eff}t$ will be referred to as an effective magnetic anisotropic constant) of an effective magnetic anisotropic energy $K_{eff}$ and a film thickness t of a recording layer FR is represented by the following expression.

$$K_{eff}t = K_i - \left[(N_z - N_x)\frac{M_s^2}{2\mu_0} - K_b\right]t$$

In the expression described above, $K_i$ is an interface magnetic anisotropic energy density, $N_z$ is a diamagnetic coefficient of the Z axis, $N_x$ is a diamagnetic coefficient of the X axis, $M_s$ is saturated magnetization, $\mu_0$ is a vacuum permeability, and $K_b$ is a bulk magnetic anisotropic energy density derived from bulk (crystalline) magnetic anisotropy or a magnetic elasticity effect. Note that, $N_x$ is identical to a diamagnetic coefficient $N_y$ of the Y axis. When the effective magnetic anisotropic constant $K_{eff}t$ per unit area is positive, the perpendicular magnetic anisotropy is exhibited, and when the effective magnetic anisotropic constant $K_{eff}t$ per unit area is negative, in-plane magnetic anisotropy is exhibited. That is, when $K_{eff}t$ is positive, the Z direction perpendicular to the film surface is the easy axis of magnetization.

In the expression described above, in a case where a junction distance D of the magnetic tunnel junction MTJ of the magnetic memory element decreases, $(N_z - N_x)$ in the expression decreases, and $K_{eff}t$ increases. Accordingly, a coercive force Hc also increases. That is, the junction distance D and the coercive force Hc of the magnetic tunnel junction MTJ have an approximately inverse proportional relationship.

Figure 2:
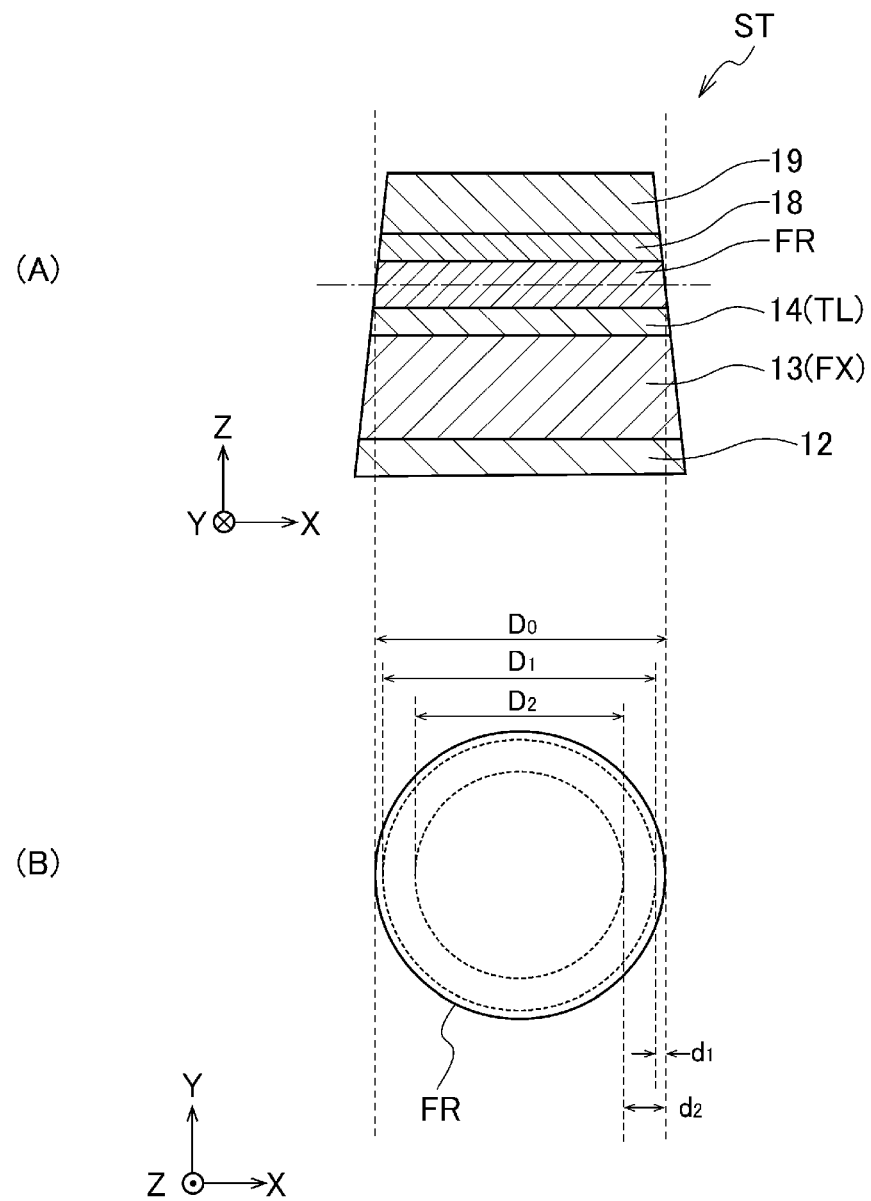
FIG. 2 shows (A): a sectional view of the columnar stack of the magnetic memory element illustrated in (A) of FIG. 1, and (B): a schematic view illustrating a sectional surface in a dashed line of (A) of FIG. 2.

In FIG. 2, (A) is a sectional view of the columnar stack ST of the magnetic memory element illustrated in (A) of FIG. 1, and (B) is a schematic view illustrating a sectional surface on a surface parallel to the X-Y plane in a dashed line of (A) of FIG. 2. In FIG. 2(A), the second ferromagnetic layer 15, the non-magnetic coupling layer 16, and the third ferromagnetic layer 17 are collectively illustrated as the recording layer FR.

The columnar stack ST is in the shape of a truncated cone, and the sectional surface of the columnar stack ST on the surface parallel to the X-Y plane in the dashed line of FIG. 2(A) is in the shape of a circle. Here, a sectional surface on a surface parallel to the X-Y plane at a height approximately in the center of a film thickness direction of the recording layer FR (the Z direction) is illustrated as the sectional surface described above. As illustrated in FIG. 2(B), the shape of the sectional surface of the columnar stack ST is in the shape of a circle having a diameter $D_0$. In the columnar stack ST in the shape of a truncated cone, the lateral surface includes a tapered inclined surface. In this embodiment, the columnar stack is in the shape of a truncated cone, but the shape of the columnar stack is not limited thereto, and may be in the shape of a circular column, an elliptical column, and an elliptical pyramid. The shape of a circular column is the shape of a column in which a sectional surface on the surface parallel to the X-Y plane described above is in the shape of a circle. The shape of an elliptical column is the shape of a column in which a sectional surface on the surface parallel to the X-Y plane described above is in the shape of an ellipse. The shape of an elliptical pyramid is the shape of an elliptical pyramid in which a sectional surface on the surface parallel to the X-Y plane described above is in the shape of an ellipse. In the columnar stack in the shape of an elliptical pyramid, the lateral surface includes a tapered inclined surface.

In the magnetic memory element 1 of this embodiment, the second insulating film 20 is an insulating film containing nitrogen, and nitrogen enters the columnar stack ST at the time of forming a film. As illustrated in FIG. 2(B), in the layer including the recording layer FR, a diameter in a position of $d_1$ inside from the outer circumferential end of the columnar stack ST is set to $D_1$, and a diameter in a position of $d_2$ inside from the outer circumferential end of the columnar stack ST is set to $D_2$. In this embodiment, in the layer including the recording layer FR, a nitrogen concentration is $7 \times 10^{30}$ atoms/m$^2$ or more in the position of $d_i$ inside from the outer circumferential end of the columnar stack ST. $d_1$, for example, is 2 nm. In addition, in the layer including the recording layer FR, the nitrogen concentration is $4 \times 10^{29}$ atoms/m$^2$ or less in the position of $d_2$ inside from the outer circumferential end of the columnar stack ST. $d_2$, for example, is 13 nm.

In this embodiment, in the layer including the recording layer FR, the availability of the detection of nitrogen in a predetermined position inside from the outer circumferential end of the columnar stack ST is defined as follows. When a spatial distribution of elements on the sectional surface of the columnar stack ST is measured by electron energy loss spectroscopy (EELS), in a case where a concentration greater than a detection limit is detected as the nitrogen concentration, it is determined that the nitrogen detection can be performed in the position. In addition, in a case where the detected nitrogen concentration is the detection limit or less, the nitrogen detection is not capable of being performed in the position. A detection limit concentration of nitrogen according to EELS is $4 \times 10^{29}$ atoms/m$^2$. That is, a portion in which the detected concentration is approximately $4 \times 10^{29}$ atoms/m$^2$ or less and a significant difference with respect to the detection limit concentration is not checked is a portion in which nitrogen is not capable of being detected by EELS. A portion in which the detected concentration is a concentration of greater than $4 \times 10^{29}$ atoms/m$^2$ is a portion in which nitrogen can be significantly detected with respect to the detection limit. In this embodiment, in the layer including the recording layer FR, the nitrogen concentration is $4 \times 10^{29}$ atoms/m$^2$ or less in a position of 13 nm inside from the outer circumferential end of the columnar stack ST. That is, nitrogen is not capable of being detected in the position of 13 nm inside from the outer circumferential end of the columnar stack ST.

Nitrogen can be detected in each position up to 13 nm from the outer circumferential end of the columnar stack ST. That is, the nitrogen concentration is greater than $4 \times 10^{29}$ atoms/m$^2$ in each of the positions up to 13 nm from the outer circumferential end of the columnar stack ST. Among them, a position of 2 nm inside from the outer circumferential end of the columnar stack ST is a portion containing nitrogen at a high concentration in which the nitrogen concentration is $7 \times 10^{30}$ atoms/m$^2$ or more.

Figure 3:
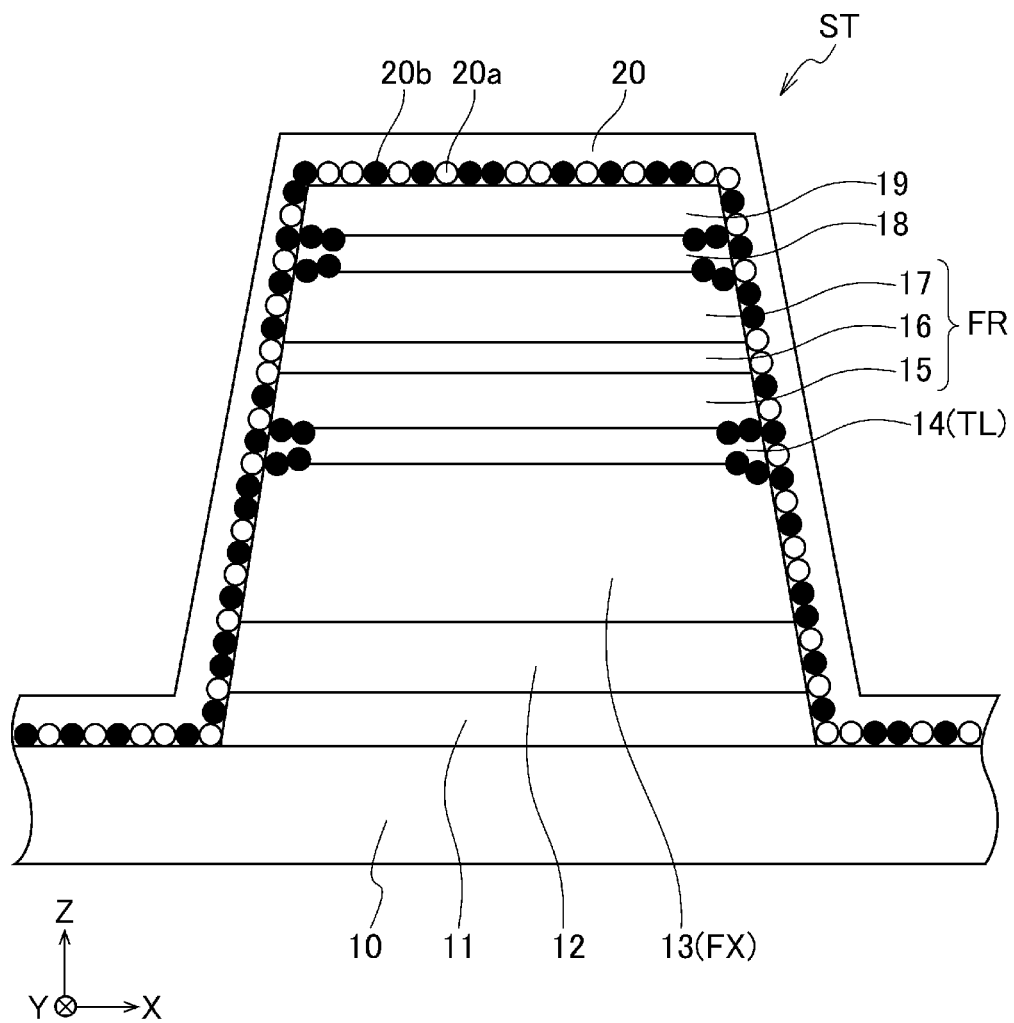
FIG. 3 is a schematic sectional view of the magnetic memory element illustrated in (A) of FIG. 1.

In the magnetic memory element 1 of this embodiment, the second insulating film 20 is an insulating film containing nitrogen, and nitrogen enters the columnar stack ST at the time of forming a film. FIG. 3 is a schematic sectional view of the magnetic memory element of this embodiment illustrated in FIG. 1(A), and schematically illustrates an aspect in which nitrogen enters the columnar stack ST.

The second insulating film 20 contains silicon nitride, and silicon atoms 20a and nitrogen atoms 20b are contained in the second insulating film 20. In the second insulating film 20, the silicon atoms 20a and the nitrogen atoms 20b are contained in accordance with a composition ratio. Here, for example, in the interface between the first non-magnetic layer 14 and upper and lower layers thereof, and in the interface between the second non-magnetic layer 18 and upper and lower layers thereof, the nitrogen atoms 20b enter the columnar stack ST from the outer circumferential end of the columnar stack ST. In this embodiment, the maximum distance at which the nitrogen atoms 20b enter the columnar stack ST is 13 nm, and the nitrogen atoms 20b enter the columnar stack ST at a high concentration in the position of 2 nm inside from the outer circumferential end of the columnar stack ST.

(1-2) Method for Producing Magnetic Memory Element of First Embodiment

Figure 4A:
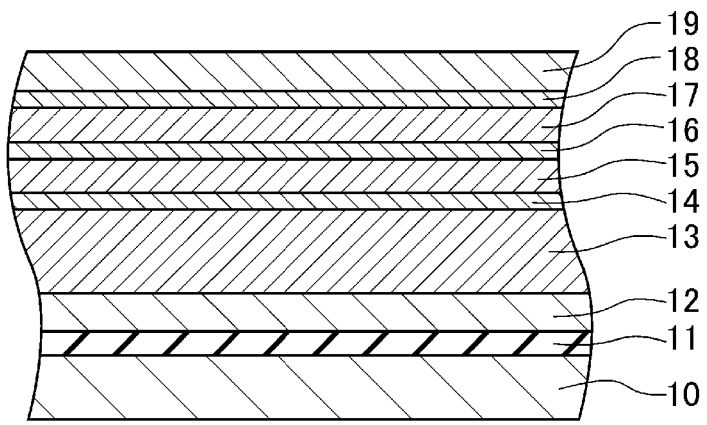
FIG. 4A is an explanatory diagram describing a stack formation step.
Figure 4B:
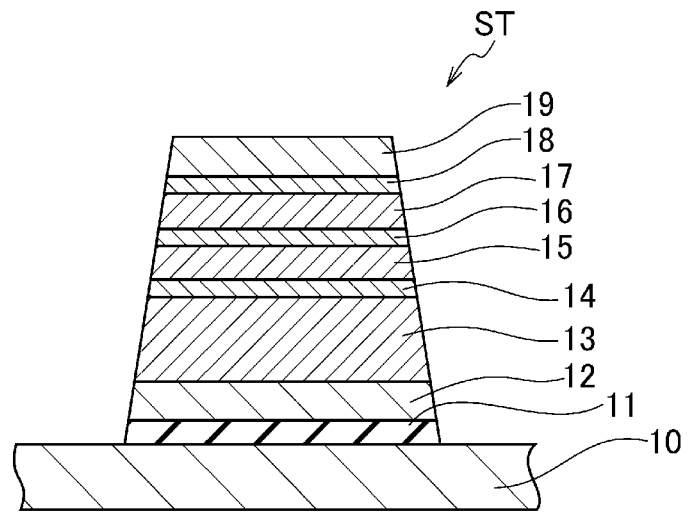
FIG. 4B is an explanatory diagram describing a columnar processing step of the stack.

Hereinafter, a method for producing the magnetic memory element 1 of this embodiment will be described with reference to FIG. 4A to FIG. 4C. First, for example, the first insulating film 11 of silicon oxide is formed on the surface of the substrate 10 containing Si by a thermal oxidation method or a chemical vapor deposition (CVD) method. Subsequently, for example, each of the first conductive layer 12, the first ferromagnetic layer 13, the first non-magnetic layer 14, the second ferromagnetic layer 15, the non-magnetic coupling layer 16, the third ferromagnetic layer 17, the second non-magnetic layer 18, and the second conductive layer 19 is stacked with a predetermined material at a predetermined film thickness, by a physical vapor deposition (PVD) method such as a sputtering method or a molecular beam epitaxy (MBE) method. Therefore, as illustrated in FIG. 4A, the stack film is formed.

Next, a resist film protecting a portion that remains as the magnetic memory element is formed, an etching treatment such as reactive ion etching (RIE) is performed by using the resist film as a mask, and a stack from the first conductive layer 12 to the second conductive layer 19 is patterned into a columnar stack. Subsequently, the resist film is removed. Therefore, as illustrated in FIG. 4B, the stack is processed, and the columnar stack ST is formed. The first insulating film 11 may be processed to be included in the columnar stack ST, the entire first insulating film 11 may remain without being included in the columnar stack ST, or only a part of the first insulating film 11 may be processed from the top. The etching described above is performed by using an etching method capable of maximally reducing damage that is introduced into the surface of the columnar stack ST to be formed. Specifically, RIE is performed in which nitrogen and hydrogen are not used as etching gas. Accordingly, the columnar stack ST can be formed by reducing the damage to be introduced.

Figure 4C:
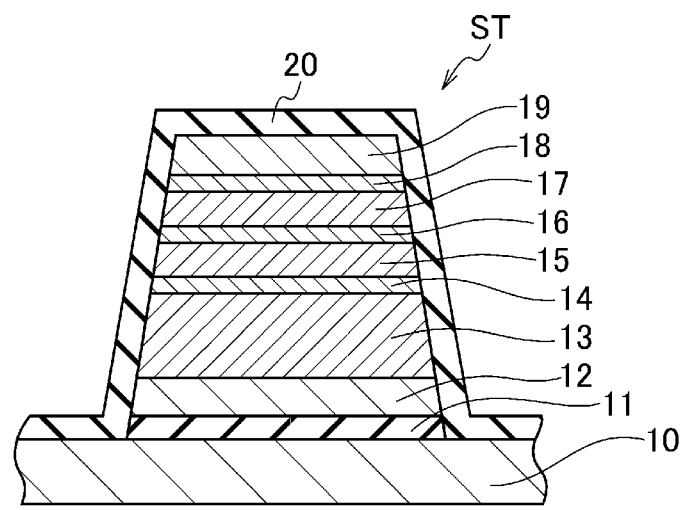
FIG. 4C is an explanatory diagram describing a second insulating film formation step.

Next, as illustrated in FIG. 4C, for example, silicon nitride is formed on the entire surface of the columnar stack ST to cover the surface by a plasma CVD method using nitrogen-containing gas such as ammonia and silicon-containing gas such as silane, and thus, the second insulating film 20 is formed. Here, silicon nitride is accumulated by plasma CVD in which a film formation temperature is 200° C. or lower. According to the plasma CVD method in which the film formation temperature is 200° C. or lower, it is possible to prevent nitrogen from entering the columnar stack ST. Specifically, the film formation temperature is 200° C. or lower, and thus, in the layer including the recording layer FR, it is possible to set the nitrogen concentration to be $4 \times 10^{29}$ atoms/m² or less in the position of 13 nm inside from the outer circumferential end of the columnar stack ST.

When silicon nitride is subjected to film formation, a high-concentration nitrogen-containing region is provided in an ultra-shallow region from the surface of the columnar stack ST, and in the layer including the recording layer FR, it is preferable that the nitrogen concentration is $7 \times 10^{30}$ atoms/m² or more in the position of 2 nm inside from the outer circumferential end of the columnar stack ST. Specifically, in order to provide the high-concentration nitrogen-containing region in the ultra-shallow region from the surface of the columnar stack ST, the surface of the columnar stack ST that is obtained by the etching treatment is subjected to a plasma nitriding treatment. The plasma nitriding treatment is applied to a nitriding treatment for forming a silicon oxynitride film as a gate insulating film of a metal-oxide-semiconductor field effect transistor (MOSFET). According to the nitriding treatment, it is possible to increase the permittivity of the gate insulating film of MOSFET and to decrease an electrical film thickness. In addition, in p-type MOSFET, boron (B) is transferred to a gate electrode containing polysilicon as conductive impurities, but it is possible to suppress the diffusion of B with respect to the gate insulating film by performing the nitriding treatment described above. In this embodiment, according to the plasma nitriding, it is possible to decrease an electron temperature of plasma (<1.5 eV), to reduce the energy of ions that are applied to the substrate by plasma, and to suppress the damage that is introduced into the surface of the columnar stack ST. The fact that a localized distribution in a surface layer of the columnar stack ST (MTJ) can be controlled is the characteristic of the plasma treatment, unlike the heat treatment that is an equilibration reaction. In addition, a high-concentration silicon nitride film has high oxidation resistance, and thus, it is possible to suppress a film increase due to oxidation at the time of performing an oxidation treatment in the subsequent step.

In the plasma CVD in which silicon nitride described above is subjected to film formation, only nitrogen-containing gas is introduced in an early stage of the film formation, and nitrogen-containing gas and silicon-containing gas are introduced from the middle, or a flow rate of nitrogen-containing gas is increased in an early stage of the film formation, and nitrogen-containing gas and silicon-containing gas of a predetermined flow rate are introduced from the middle, and thus, a nitrogen concentration in silicon nitride to be formed in an early stage may be increased.

(1-3) Operation of Magnetic Memory Element

Hereinafter, the operation of the magnetic memory element 1 of this embodiment will be described. First, a write operation will be described. In the write operation of "1", a predetermined write voltage is applied between the first conductive layer 12 and the second conductive layer 19 of the magnetic memory element 1, and thus, a current is applied to the magnetic memory element 1. At this time, the magnetization direction M15 of the second ferromagnetic layer 15 and the magnetization direction M17 of the third ferromagnetic layer 17, configuring the recording layer FR, and the magnetization direction M13 of the first ferromagnetic layer 13 configuring the reference layer FX are in an anti-parallel state, and the magnetic memory element 1 is in a high resistance state, and thus, for example, information "1" is recorded. On the other hand, in the write operation of "0", a current is applied in a direction reverse to that of the write operation of "1", and in the recording layer FR, the magnetization direction is reversed by a spin transfer. At this time, the magnetization direction M15 of the second ferromagnetic layer 15 and the magnetization direction M17 of the third ferromagnetic layer 17, configuring the recording layer FR, and the magnetization direction M13 of the first ferromagnetic layer 13 configuring the reference layer FX are in a parallel state, and the magnetic memory element 1 is in a low resistance state, and thus, for example, information "0" is recorded.

Next, a read operation will be described. A predetermined read voltage is applied between the first conductive layer 12 and the second conductive layer 19 of the magnetic memory element 1 in which "1" or "0" is written, and thus, a read current is applied. The read current is detected by a sense amplifier, and a difference in signals due to a resistance change of the magnetic memory element 1 is read. Accordingly, for example, when the magnetic memory element 1 is in a high resistance state, the information "1" is read, and when the magnetic memory element 1 is in a low resistance state, the information "0" is read.

(1-4) Action and Effect of Magnetic Memory Element

In the layer including the recording layer FR, the nitrogen concentration is $4 \times 10^{29}$ atoms/m² or less in the position of 13 nm inside from the outer circumferential end of the columnar stack ST, and thus, it is possible to suppress the introduction of nitrogen with respect to the recording layer FR or the barrier layer TL, to suppress a decrease in the coercive force, and to improve coercive properties. In addition, in the layer including the recording layer FR, the nitrogen concentration is $7 \times 10^{30}$ atoms/m² or more in the position of 2 nm inside from the outer circumferential end of the columnar stack ST, and thus, it is possible to suppress a leak current that occurs in the vicinity of the interface between the columnar stack and the protective film. Therefore, in the magnetic memory element, an improvement in the properties of the magnetic memory element, such as an improvement in the coercive properties or a reduction in the leak current, can be attained.

(2) Examples (2-1) Preparation of Example 1

The first insulating film 11 (100 nm) was formed on the substrate 10 containing silicon by a thermal oxidation treatment, and the first conductive layer 12 (26 nm) including a stack of Ta and Ru, the first ferromagnetic layer 13 (12 nm) including a stack of Co and Pt, the first non-magnetic layer 14 (1.1 nm) containing MgO, the second ferromagnetic layer 15 (1.2 nm) containing CoFeB, the non-magnetic coupling layer 16 (0.5 nm) containing Ta, the third ferromagnetic layer 17 (1.0 nm) containing CoFeB, the second non-magnetic layer 18 (1.0 nm) containing MgO, and the second conductive layer 19 (70 nm) containing Ta were stacked by a sputtering method. Next, an RIE treatment was performed by using a resist film as a mask, and the stack of the first conductive layer 12 to the second conductive layer 19 was patterned into a columnar stack. Subsequently, a plasma nitriding treatment was performed, and then, silicon nitride was accumulated on the front surface to cover the columnar stack ST by plasma CVD in which a treatment temperature was 300° C., and thus, the second insulating film 20 was formed. As described above, a magnetic memory element was prepared, and was set to Example 1.

(2-2) Preparation of Example 2

A magnetic memory element was prepared as with Example 1 except that the treatment temperature of the plasma CVD at the time of forming the second insulating film 20 (30 nm) was 200° C. compared to Example 1, and was set to Example 2.

(2-3) Preparation of Thin Film Sample for EELS Measurement

Figure 5:
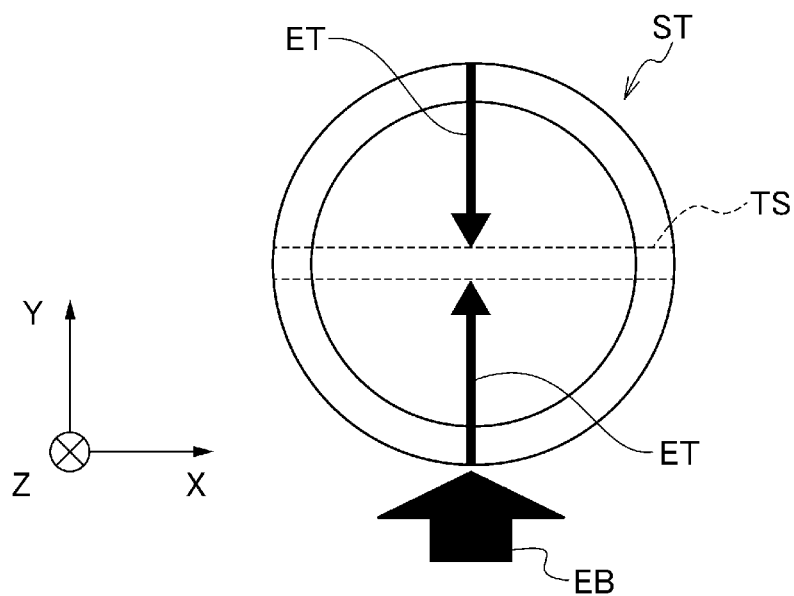
FIG. 5 is an explanatory diagram describing a step of preparing a thin film sample for electron energy-loss spectroscopy (EELS) measurement.
Figure 6:
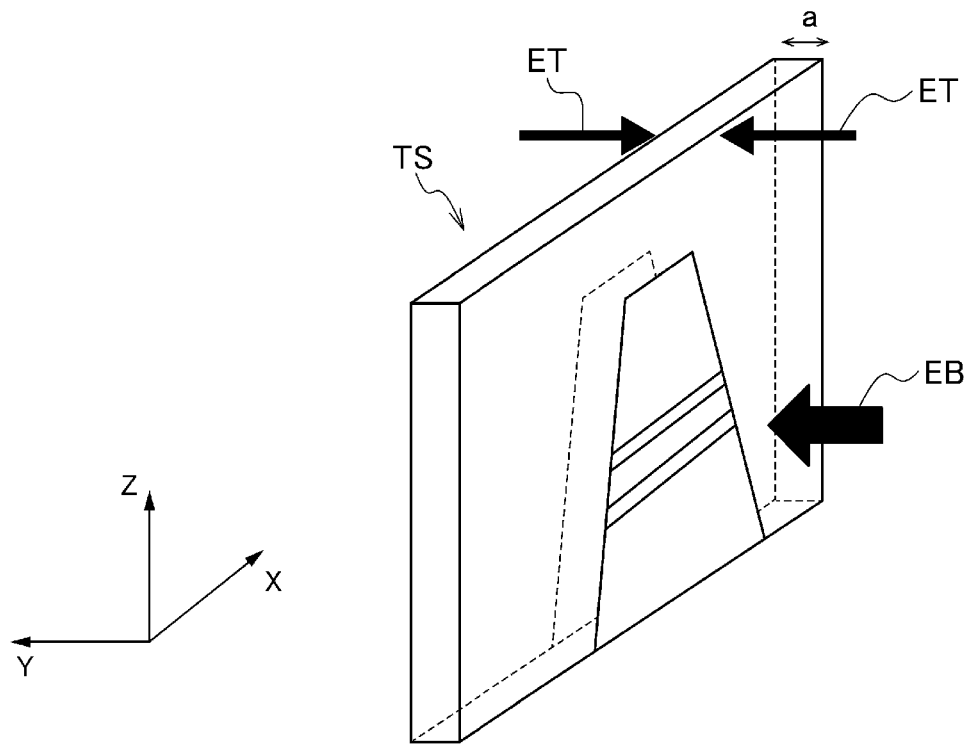
FIG. 6 is an explanatory diagram describing the thin film sample for EELS measurement.

A columnar stack of the magnetic memory element according to Example 1 and Example 2 obtained as described above was formed into a thin film, and thus, a thin film sample TS was prepared. FIG. 5 is an explanatory diagram describing a step of preparing the thin film sample for EELS measurement. Specifically, film-thinning ET was performed in a Y direction and a −Y direction from the lateral surface of the columnar stack ST by using a focused ion beam (FIB) method. FIG. 6 is an explanatory diagram describing the thin film sample for the EELS measurement. According to the film-thinning ET described above, the thin film sample TS, for example, having a thickness a of approximately 50 nm was prepared in the Y direction. Note that, in the preparation of the thin film sample TS, a buried layer containing carbon or tungsten, resin, or the like was provided around the columnar stack ST to protect the columnar stack ST. A thickness direction (the Y direction) of the thin film sample TS is an irradiation direction of an electron beam EB at the time of performing the EELS measurement.

(2-4) EELS Measurement

A transmission electron microscope (TEM) image of the sectional surface of the columnar stack of the magnetic memory element according to Example 1 and Example 2 obtained as described above was acquired. Specifically, an electron was incident at an acceleration voltage of 200 kV along a thickness direction of the thin film sample TS obtained as described above, element analysis was performed in an electron beam irradiation spot by electron energy loss spectroscopy (EELS) for dispersing an inelastic scattering electron in which the energy was lost by a mutual action with respect to a sample substance, mapping processing was performed from obtained data, and the spatial distribution thereof was imaged. In the EELS measurement, absorption due to the transition of each inner shell electron of a K shell of O, an L shell of Fe, an L shell of Co, a K shell of B, a K shell of N, and an M shell of Ru was measured in each irradiation spot, and the element analysis was performed.

(2-5) TEM Image

Figure 7:
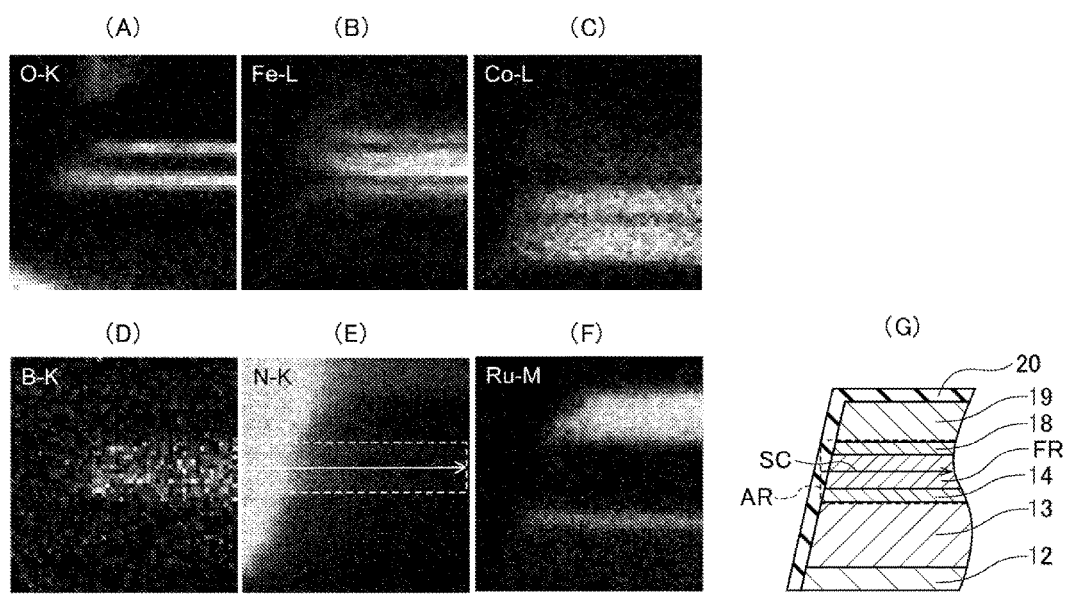
FIG. 7 shows (A) to (F): TEM images representing a spatial distribution of elements on a sectional surface of a magnetic memory element of Example 1, according to EELS, and (G): a schematic sectional view illustrating portions corresponding to (A) to (F) of FIG. 7.

In FIG. 7, (A) to (F) are TEM images representing spatial distributions of elements on the sectional surface of the magnetic memory element of Example 1, according to EELS, and (G) is a schematic sectional view illustrating portions corresponding to (A) to (F).

FIG. 7(A) illustrates the spatial distribution of O from the absorption due to the transition of the inner shell electron of the K shell of O. From FIG. 7(A), it was checked that O was contained in the first non-magnetic layer 14 and the second non-magnetic layer 18.

FIG. 7(B) illustrates the spatial distribution of Fe from the absorption due to the transition of the inner shell electron of the L shell of Fe. From FIG. 7(B), it was checked that Fe was mainly contained in the recording layer FR.

FIG. 7(C) illustrates the spatial distribution of Co from the absorption due to the transition of the inner shell electron of the L shell of Co. From FIG. 7(C), it was checked that Co was contained in the first ferromagnetic layer 13 and the recording layer FR.

FIG. 7(D) illustrates the spatial distribution of B from the absorption due to the transition of the inner shell electron of the K shell of B. From FIG. 7(D), it was checked that B was contained in the recording layer FR.

FIG. 7(E) illustrates the spatial distribution of N from the absorption due to the transition of the inner shell electron of the K shell of N. From FIG. 7(E), it was checked that a nitride film was formed to cover the columnar stack ST.

Figure 8:
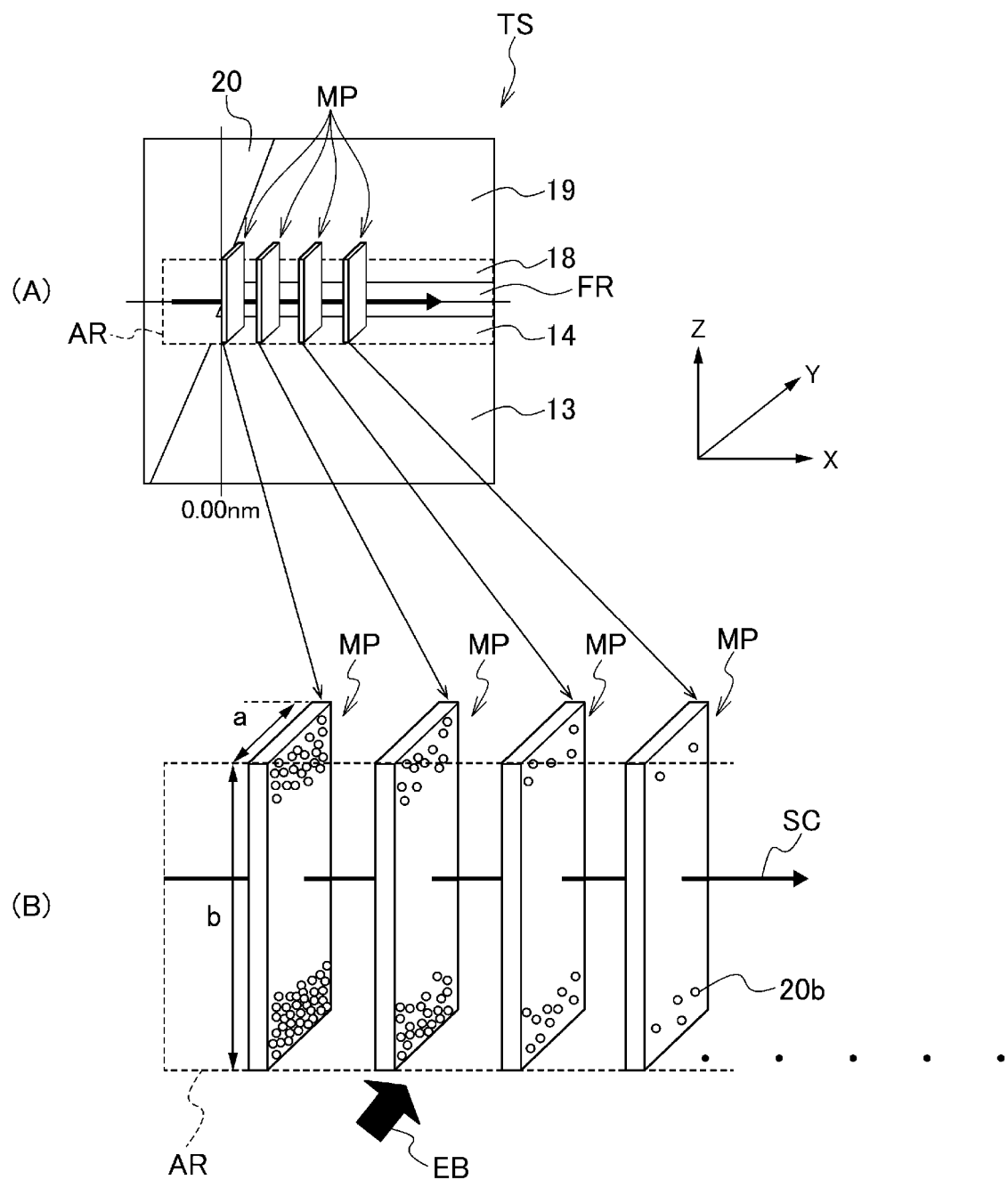
FIG. 8 shows (A): an explanatory diagram describing a measuring plane in nitrogen concentration measurement, and (B): an enlarged view of the measuring plane illustrated in (A) of FIG. 8.

A region surrounded by a dotted line of FIG. 7(E) corresponds to a target area AR of N concentration measurement, surrounding the first non-magnetic layer 14, the recording layer FR, and the second non-magnetic layer 18 in FIG. 7(G). The concentration of N to be distributed in the target area AR is measured from the outer circumference of the columnar stack ST to the inside (in a direction illustrated by an arrow SC in FIG. 7(G)), and thus, it is possible to obtain an intensity profile of N with respect to a distance from the outer circumferential end of the columnar stack ST (MTJ) in the target area AR. Here, a nitrogen concentration in a position of a predetermined distance (for example, 2 nm or 13 nm) from the outer circumferential end of the columnar stack ST is a nitrogen concentration in a position of a predetermined distance from the outer circumferential end of the columnar stack ST of a target layer (a layer including the recording layer FR, the first non-magnetic layer 14, and the second non-magnetic layer 18). Specifically, the lateral surface of the columnar stack ST is a tapered inclined surface, and thus, the nitrogen concentration indicates an average nitrogen concentration at a point at which the center line of the recording layer FR intersects with the outer circumference of the columnar stack ST, that is, an average nitrogen concentration in the target area AR in a position of L nm inside from the end of the recording layer FR. Here, in the thin film sample TS described above, a measuring plane at the time of measuring the nitrogen concentration will be described. In FIG. 8, (A) is an explanatory diagram describing the measuring plane of the thin film sample in nitrogen concentration measurement, and (B) is an enlarged view of the measuring plane illustrated in (A) of FIG. 8. A measuring plane MP of the thin film sample TS is defined by the thickness a of the thin film sample TS in the Y direction×a width b of the target area AR in the Z direction, and is perpendicular to the X direction (a surface parallel to a YZ plane). The irradiation direction of the electron beam EB is the thickness direction of the thin film sample TS (the Y direction). The nitrogen atoms 20b detected on each measuring plane are schematically illustrated by O in the drawing. The nitrogen concentration in each position from the outer circumferential end of the columnar stack ST corresponds to the number of N atoms detected in the area of the measuring plane MP, in each of the position from the outer circumferential end of the columnar stack ST. Accordingly, the nitrogen concentration to be obtained from the EELS mapping corresponds to a surface density of N, and unit is "atoms/m$^2$". In this example, the nitrogen concentration averaged in a direction perpendicular to the film surface in the target area AR surrounded by the dotted line of FIG. 7(E) (the Z direction) was measured from the outer circumference of the columnar stack ST to the inside (in the direction illustrated by the arrow SC), and thus, the intensity profile of N was obtained.

FIG. 7(F) illustrates the spatial distribution of Ru from the absorption due to the transition of the inner shell electron of the M shell of Ru. From FIG. 7(F), it was checked that Ru was contained in the first ferromagnetic layer 13 and the second conductive layer 19.

Figure 9:
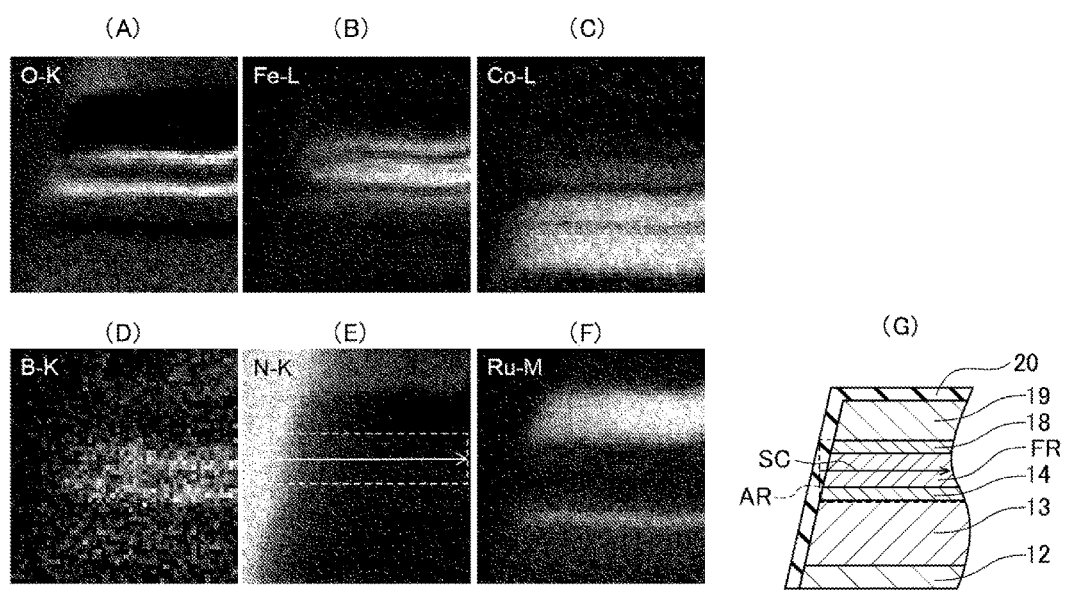
FIG. 9 shows (A) to (F): TEM images illustrating a spatial distribution of elements on a sectional surface of a magnetic memory element of Example 2, according to EELS, and (G): a schematic sectional view illustrating portions corresponding to (A) to (F) of FIG. 9.

In FIG. 9, (A) to (F) are TEM images illustrating spatial distributions of elements on the sectional surface of the magnetic memory element of Example 2, according to EELS, and (G) is a schematic sectional view illustrating portions corresponding to (A) to (F) of FIG. 9.

FIG. 9(A) illustrates the spatial distribution of O from the absorption due to the transition of the inner shell electron of the K shell of O. As with Example 1, from FIG. 9(A), it was checked that 0 was contained in the first non-magnetic layer 14 and the second non-magnetic layer 18.

FIG. 9(B) illustrates the spatial distribution of Fe from the absorption due to the transition of the inner shell electron of the L shell of Fe. As with Example 1, from FIG. 9(B), it was checked that Fe was mainly contained in the recording layer FR.

FIG. 9(C) illustrates the spatial distribution of Co from the absorption due to the transition of the inner shell electron of the L shell of Co. As with Example 1, from FIG. 9(C), it was checked that Co was contained in the first ferromagnetic layer 13 and the recording layer FR.

FIG. 9(D) illustrates the spatial distribution of B from the absorption due to the transition of the inner shell electron of the K shell of B. As with Example 1, from FIG. 9(D), it was checked that B was contained in the recording layer FR.

FIG. 9(E) illustrates the spatial distribution of N from the absorption due to the transition of the inner shell electron of the K shell of N. As with Example 1, from FIG. 9(E), it was checked that a nitride film was formed to cover the columnar stack ST. Note that, as with Example 1, the number of N atoms to be distributed in the target area AR is measured from the outer circumference of the columnar stack ST to the inside (in a direction illustrated by an arrow SC in FIG. 9(G)), and thus, it is possible to obtain an intensity profile of N with respect to a distance from the outer circumferential end of the columnar stack ST (MTJ) in the target area AR.

FIG. 9(F) illustrates the spatial distribution of Ru from the absorption due to the transition of the inner shell electron of the M shell of Ru. As with Example 1, from FIG. 9(F), it was checked that Ru was contained in the first ferromagnetic layer 13 and the second conductive layer 19.

(2-6) Intensity Profile of N

Figure 10A:
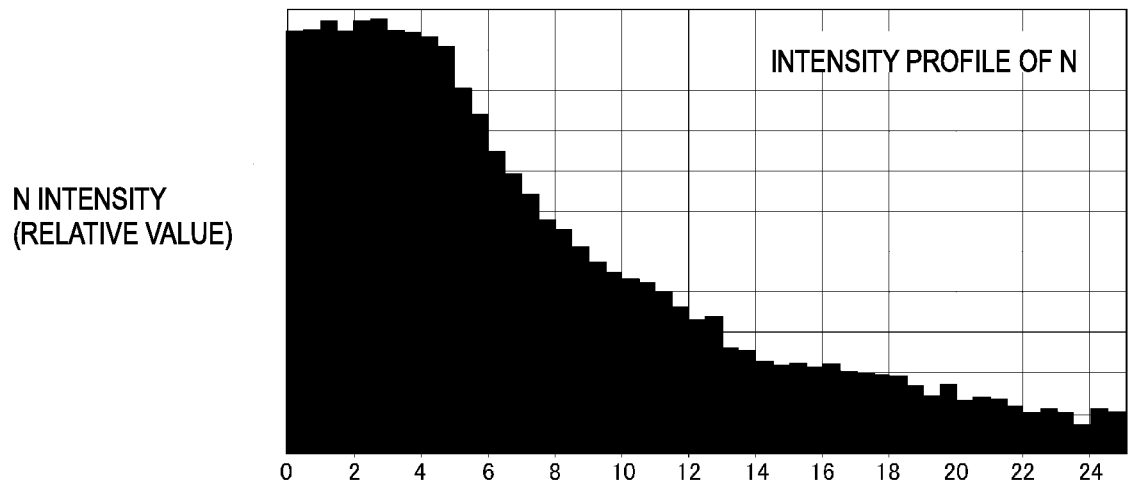
FIG. 10A is a graph showing a nitrogen (N) intensity distribution on the sectional surface of the magnetic memory element of Example 1, with respect to a distance from an outer circumferential end of a columnar stack ST (MTJ), according to EELS.

FIG. 10A is the N intensity (the N profile) with respect to the distance from the outer circumferential end of the columnar stack ST (MTJ) according to Example 1, which was obtained from the spatial distribution of N illustrated in FIG. 7(E). The N intensity increases as the distance from the MTJ end decreases (is close to the MTJ lateral surface), and the N intensity decreases as the distance from the MTJ end increases (is away from the MTJ lateral surface).

Figure 10B:
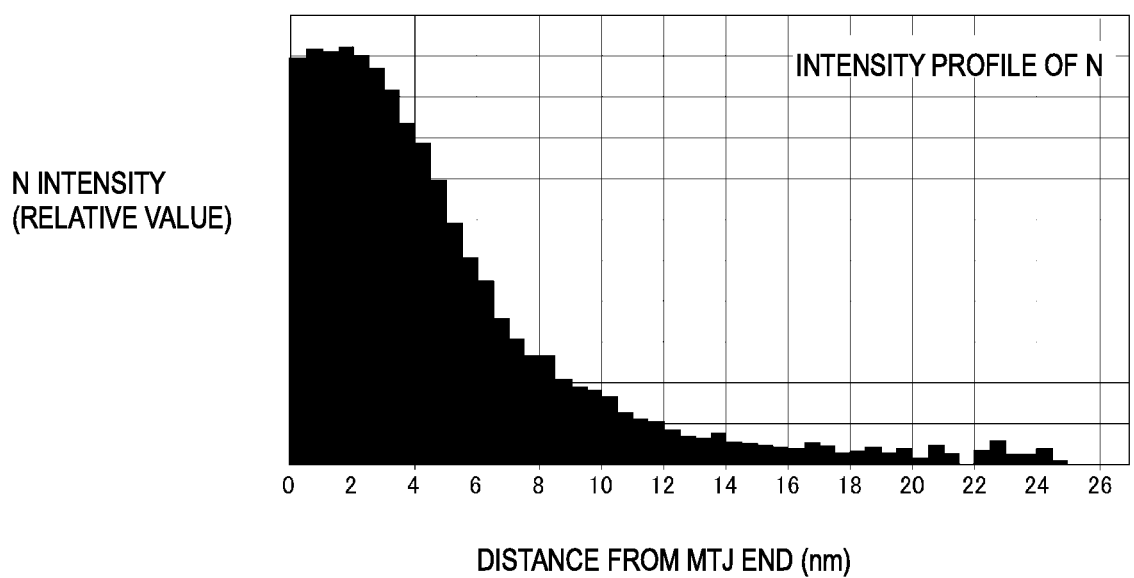
FIG. 10B is a graph showing a nitrogen (N) intensity distribution on the sectional surface of the magnetic memory element of Example 2, with respect to the distance from the outer circumferential end of the columnar stack ST (MTJ), according to EELS.

FIG. 10B is the N intensity (the N profile) with respect to the distance from the outer circumferential end of the columnar stack ST (MTJ) according to Example 2, which was obtained from the spatial distribution of N illustrated in FIG. 9(E). As with Example 1, the N intensity increases as the distance from the MTJ end decreases (is close to the MTJ lateral surface), and the N intensity decreases as the distance from the MTJ end increases (is away from the MTJ lateral surface).

In the case of comparing Example 2 of FIG. 10B with Example 1 of FIG. 10A, in Example 2, the N intensity more precipitously decreases as being directed toward the inside from the MTJ end. This indicates that in Example 2, a region in which N exists remains in a shallower portion from the lateral surface of MTJ than in Example 1.

Figure 11:
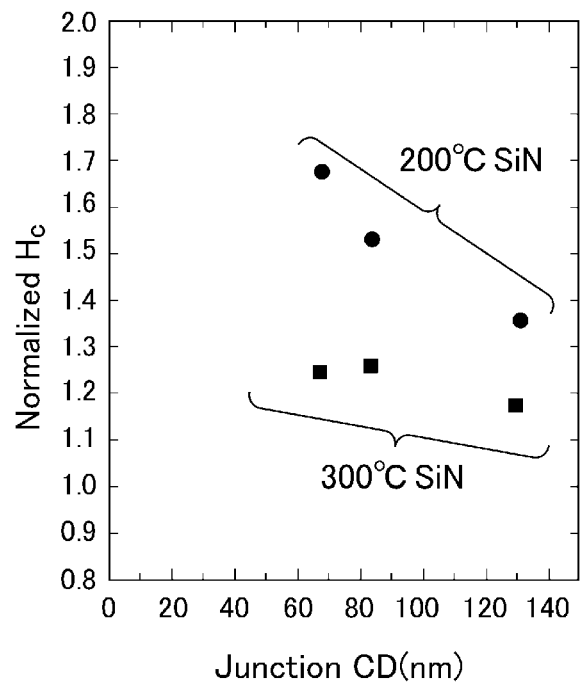
FIG. 11 is a graph showing a coercive force Hc with respect to a junction distance D (a junction CD) of the magnetic memory element of Example 1 and Example 2.

FIG. 11 is a graph showing the coercive force Hc with respect to the junction distance D (a junction CD) of the magnetic memory element of Example 1 and Example 2. Example 1 in which a film formation temperature of SiN is 300° C. is plotted with ■, and Example 2 in which the film formation temperature of SiN is 200° C. is plotted with ●.

In FIG. 11, in Example 2, in a case where the junction distance D (the junction CD) of the magnetic memory element decreases, the coercive force Hc increases, and the junction distance D and the coercive force Hc of the magnetic tunnel junction MTJ have an approximately inverse proportional relationship. This is a result consistent with the expression of $K_{eff}t$ described above. On the other hand, in Example 1, the coercive force Hc is less than that in Example 2 in any junction distance D, and the junction distance D and the coercive force Hc of the magnetic tunnel junction MTJ do not have the inverse proportional relationship. It is considered that this is because N exists from the outer circumferential end of MTJ to a deep region inside, and thus, the resistance value increases regardless of the junction distance D, and therefore, the coercive force decreases.

Figure 12:
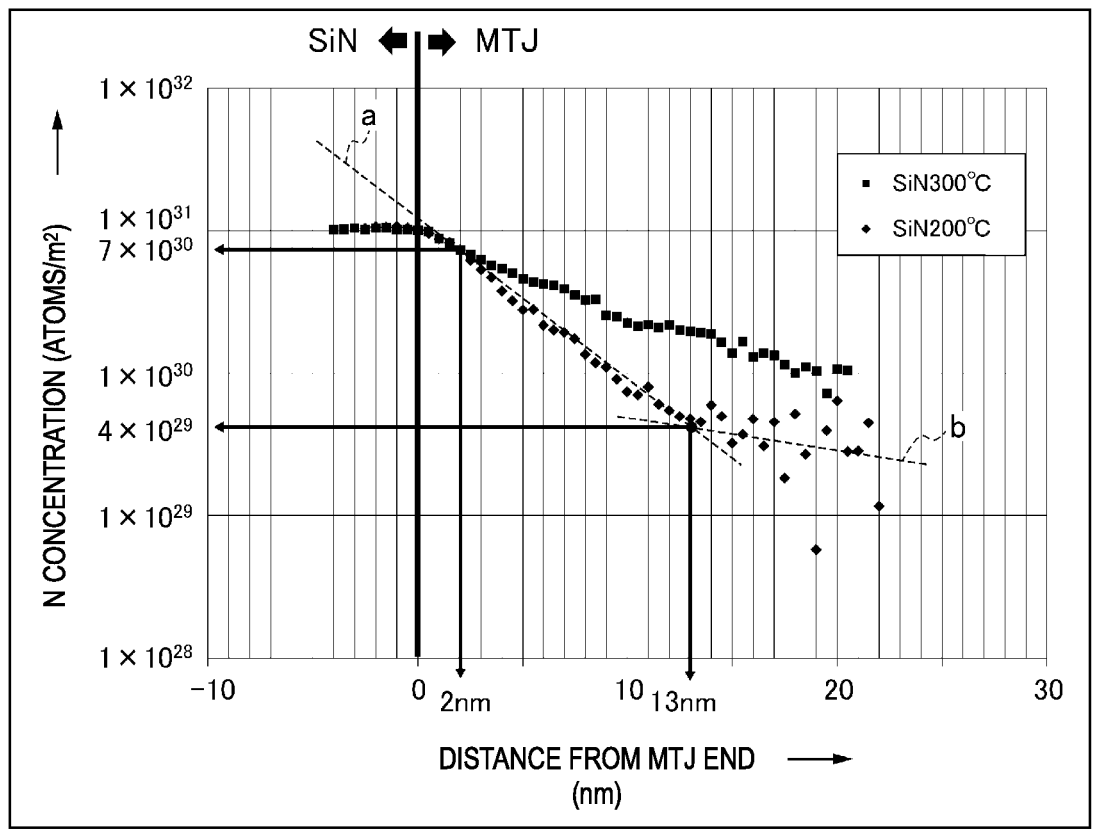
FIG. 12 is a graph showing a nitrogen (N) concentration of the magnetic memory element of Example 1 and Example 2, with respect to the distance from the outer circumferential end of the columnar stack ST (MTJ), according to EELS.

FIG. 12 is a graph showing the nitrogen (N) concentration with respect to the distance from the outer circumferential end of the columnar stack ST (MTJ) of the magnetic memory element of Example 1 and Example 2, according to EELS. A vertical axis is the N concentration, and is a numerical value obtained from the N intensity profile shown in FIG. 10A and FIG. 10B. A horizontal axis is the distance from the MTJ end, and indicates that the position is more inside from the outer circumferential end of MTJ as the distance increases. A position in which the distance from MTJ is 0 is a point at which the center line of the recording layer FR intersects with the outer circumference of the columnar stack ST, that is, an end position of the recording layer, and corresponds to the interface between MTJ and SiN. Example 1 in which the film formation temperature of SiN is 300° C. is plotted with ■, and Example 2 in which the film formation temperature of SiN is 200° C. is plotted with ♦.

With reference to FIG. 12, in Example 1, the N concentration decreases as becoming deeper from the surface of MTJ, from the surface of MTJ to a depth of approximately 20 nm, and is homogeneously changed. In addition, in Example 2, the N concentration decreases as becoming deeper from the surface of MTJ, from the surface of MTJ to a depth of 13 nm, and is homogeneously changed along a line a. A line b obtained by performing linear approximation with respect to a change in the N concentration by a least-square method is illustrated inside from 13 nm, the N concentration is irregularly changed, and a stable value of the N concentration is not obtained inside from 13 nm. From such a result, it is considered that the N concentration is a detection limit or less inside from 13 nm. The detection limit is $4\times10^{29}$ atoms/m$^2$. As described above, in Example 2, in the layer including the recording layer FR, the nitrogen concentration is $4\times10^{29}$ atoms/m$^2$ or less in the position of 13 nm inside from the outer circumferential end of the columnar stack ST (MTJ). Accordingly, it is possible to suppress the introduction of nitrogen with respect to the recording layer FR or the barrier layer TL, to suppress a decrease in the coercive force, and to improve the coercive properties.

In both of Example 1 and Example 2, the nitrogen concentration is $7\times10^{30}$ atoms/m$^2$ or more in the position of 2 nm inside from the outer circumferential end of the columnar stack ST, in the layer including the recording layer FR. Accordingly, it is possible to suppress a leak current that occurs in the vicinity of the interface between the columnar stack and the protective film.

(3) Application Example

Figure 13:
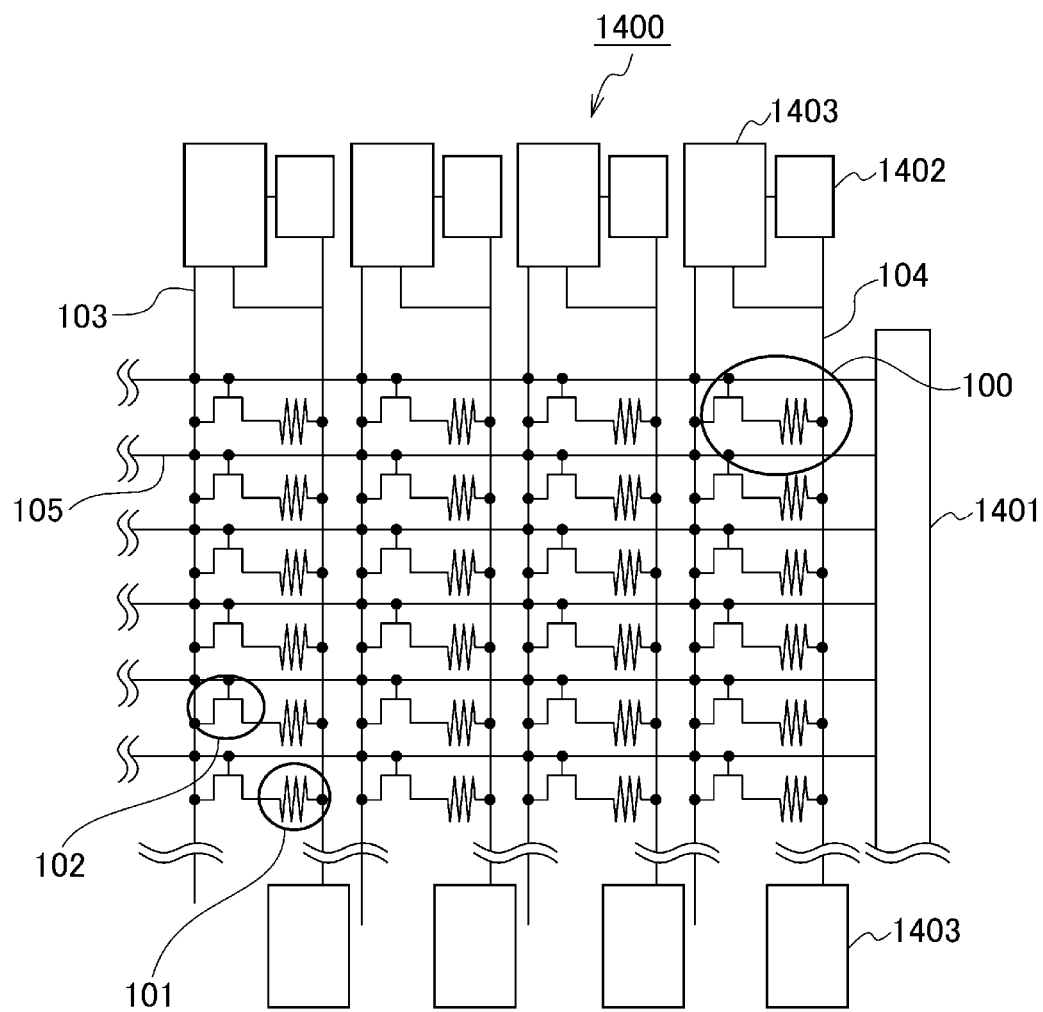
FIG. 13 is a block diagram illustrating a configuration of a magnetic memory device using the magnetic memory element of the first embodiment of the invention.

Next, a magnetic memory device 1400 (MRAM) using a magnetic memory element 101 of the first embodiment of the invention as a storage element will be described. FIG. 13 is a block diagram illustrating the configuration of the magnetic memory device using the magnetic memory element of the first embodiment. The magnetic memory element 1 described in the first embodiment can be applied as the magnetic memory element 101. As illustrated in FIG. 13, in a memory array of the magnetic memory device 1400, memory cells 100 are arranged in the shape of an array. The memory cell 100 includes the magnetic memory element 101 and a selection transistor 102. A plurality of source lines 103 that are arranged in parallel to each other, bit lines 104 that are arranged in parallel to the source lines 103 and are arranged in parallel to each other, and a plurality of word lines 105 that are arranged perpendicularly to the bit lines 104 and are in parallel to each other are provided such that the memory cells 100 are connected in a row direction or a column direction. In addition, the magnetic memory device 1400 includes a circuit that applies a current in a direction perpendicular to the film surface of the magnetic memory element 101 in the memory cell 100, and a peripheral circuit.

The bit line 104 is electrically connected to a drain electrode of the selection transistor 102 through the magnetic memory element 101, and the source line 103 is electrically connected to a source electrode of the selection transistor 102 through a wiring layer. In addition, the word line 105 is electrically connected to a gate electrode of the selection transistor 102. One end of the source line 103 and one end of the bit line 104 are electrically connected to a write driver 1403 and a sense amplifier 1402 for applying a voltage. One end of the word line 105 is electrically connected to the word driver 1401.

The selection transistor 102 and a peripheral circuit are capable of including MOSFET. Such circuits may include complementary MOSFET (CMOSFET) in order to decrease the power consumption.

In the write operation of the information a voltage is applied to the source line 103 from the write driver 1403, and a voltage is applied to the word line 105 from the word driver 1401, and thus, a current is applied to the bit line 104 from the source line 103 through the magnetic memory element 101. At this time, the magnetization of a recording layer in which a magnetization direction of the magnetic memory element 101 is variable and the magnetization arrangement of a reference layer in which a magnetization direction is fixed are in an anti-parallel state, and the magnetic memory element 101 is in a high resistance state, and thus, information to be retained is "1".

On the other hand, in the write operation of the information "0", a voltage is applied to the bit line 104 from the write driver 1403, and a voltage is applied to the word line 105 from the word driver 1401, and thus, a current is applied to the source line 103 from the bit line 104 through the magnetic memory element 101. That is, in the write operation of the information "0", a current is applied in a direction reverse to that of the write operation of the information "1", and thus, in the recording layer of the magnetic memory element 101, the magnetization is reversed by a spin transfer. At this time, the magnetization of the recording layer in which the magnetization direction of the magnetic memory element 101 is variable and the magnetization arrangement of the reference layer in which the magnetization direction is fixed are in a parallel state, and the magnetic memory element 101 is in a low resistance state, and thus, information to be retained is "0".

At the time of reading, a difference in the signals due to a change in the resistance is read by using the sense amplifier 1402. The magnetic memory device (MRAM) having such a configuration is a memory device using a memory cell in which a magnetoresistance change rate is large, and a read current is small.

(4) Second Embodiment

Figure 14:
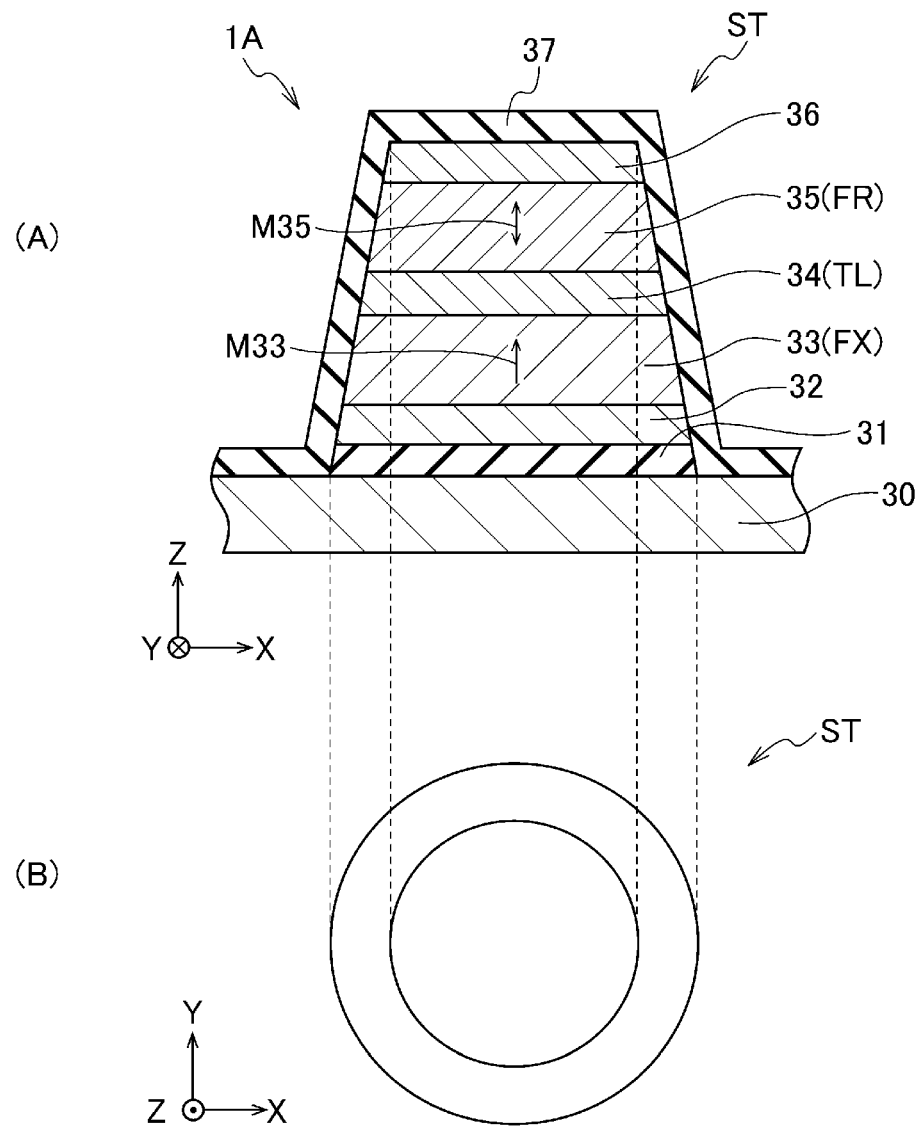
FIG. 14 shows (A): a sectional view of a magnetic memory element of a second embodiment of the invention, and (B): a schematic view of an upper surface of a columnar stack configuring the magnetic memory element of (A) of FIG. 14.

A magnetic memory element 1A of a second embodiment of the invention will be described with reference to (A) and (B) of FIG. 14. In FIG. 14, (A) is a sectional view of the magnetic memory element 1A, and (B) is a schematic view of an upper surface of a columnar stack configuring the magnetic memory element 1A of (A) of FIG. 14. The magnetic memory element 1A includes the columnar stack ST stacked in the Z direction, in the main surface of the substrate 10 (the surface parallel to the XY surface).

The columnar stack ST has a structure in which a first insulating film 31, a first conductive layer 32, a first ferromagnetic layer 33, a first non-magnetic layer 34, a second ferromagnetic layer 35, and a second conductive layer 36 are stacked in this order from a substrate 30 side. In addition, a second insulating film that is a protective film and covers the lateral surface of the columnar stack ST is provided.

In the magnetic memory element 1A, the reference layer FX includes the first ferromagnetic layer 33. The barrier layer TL includes the first non-magnetic layer 34. The recording layer FR includes the second ferromagnetic layer 35. A magnetization direction M33 of the first ferromagnetic layer 33 of the reference layer FX and a magnetization direction M35 of the second ferromagnetic layer 35 of the recording layer FR are the direction perpendicular to the film surface (the Z direction). The magnetic memory element 1A of this embodiment is a perpendicular magnetization type magnetic memory element. The columnar stack ST is a stack having a magnetic tunnel junction (MTJ).

The magnetic memory element 1A of this embodiment described above is different from the magnetic memory element 1 of the first embodiment in that the non-magnetic coupling layer 16 is not provided, and the second ferromagnetic layer 15 and the third ferromagnetic layer 17 are configured as one second ferromagnetic layer 35. In addition, the second non-magnetic layer 18 (the protective layer) of the magnetic memory element 1 of the first embodiment is not provided in the magnetic memory element 1A of the second embodiment. The magnetic memory element 1A of this embodiment has the same configuration as that of the magnetic memory element 1 of the first embodiment except for the above description. That is, the substrate 30 has the same configuration as that of the substrate 10 of the first embodiment. The first insulating film 31 has the same configuration as that of the first insulating film 11 of the first embodiment. The first conductive layer 32 has the same configuration as that of the first conductive layer 12 of the first embodiment. The first ferromagnetic layer 33 has the same configuration as that of the first ferromagnetic layer 13 of the first embodiment. The first non-magnetic layer 34 has the same configuration as that of the first non-magnetic layer 14 of the first embodiment. The second ferromagnetic layer 35 has the same configuration as that of the second ferromagnetic layer 15 or the third ferromagnetic layer 17 of the first embodiment. The second conductive layer 36 has the same configuration as that of the second conductive layer 19 of the first embodiment. The second insulating film 37 has the same configuration as that of the second insulating film 20 of the first embodiment.

Figure 15:
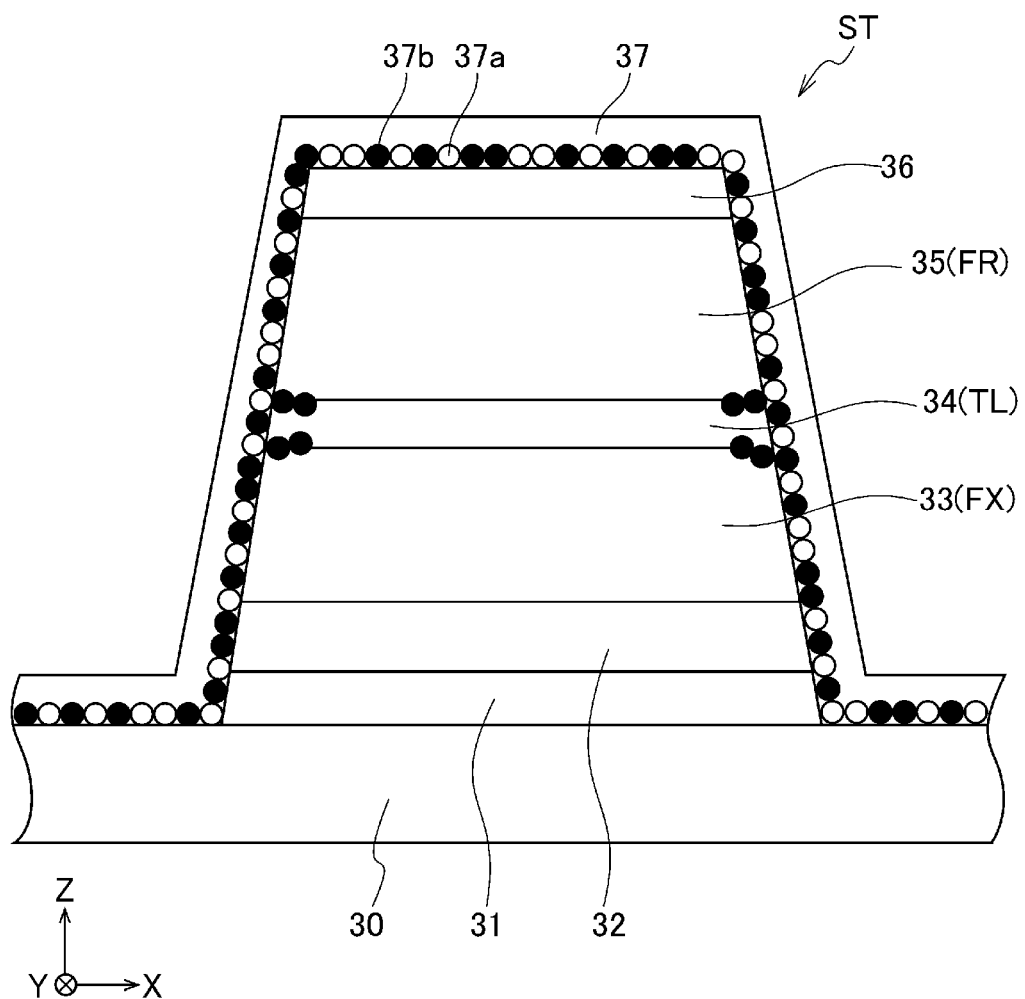
FIG. 15 is a schematic sectional view of the magnetic memory element illustrated in (A) of FIG. 14.

In the magnetic memory element 1A of this embodiment, the second insulating film 37 is an insulating film containing nitrogen, and nitrogen enters the columnar stack ST at the time of forming a film. FIG. 15 is a schematic sectional view of the magnetic memory element of this embodiment illustrated in FIG. 14(A), and schematically illustrates an aspect in which nitrogen enters the columnar stack ST.

The second insulating film 37 contains silicon nitride, and silicon atoms 37a and nitrogen atoms 37b are contained in the second insulating film 37. In the second insulating film 37, the silicon atoms 37a and the nitrogen atoms 37b are contained in accordance with a composition ratio. Here, for example, in the interface between the first non-magnetic layer 34 and upper and lower layers thereof, the nitrogen atoms 37b enter the columnar stack ST from the outer circumferential end of the columnar stack ST. In this embodiment, the maximum distance at which the nitrogen atoms 37b enter the columnar stack ST is 13 nm, and in one or both of the recording layer FR and the barrier layer TL, a nitrogen concentration is $4 \times 10^{29}$ atoms/m$^2$ or less in a position of 13 nm inside from the outer circumferential end of the columnar stack ST. In addition, the nitrogen atoms 37b enter the columnar stack ST at a high concentration in a position of 2 nm inside from the outer circumferential end of the columnar stack ST, and in one or both of the recording layer FR and the barrier layer TL, the nitrogen concentration is $7 \times 10^{30}$ atoms/m$^2$ or more in the position of 2 nm inside from the outer circumferential end of the columnar stack ST.

In one or both of the recording layer FR and the barrier layer TL, the nitrogen concentration is $4 \times 10^{29}$ atoms/m$^2$ or less in the position of 13 nm inside from the outer circumferential end of the columnar stack ST, and thus, it is possible to suppress the introduction of nitrogen with respect to the recording layer FR or the barrier layer TL, to suppress a decrease in the coercive force, and to improve the coercive properties. In addition, in one or both of the recording layer FR and the barrier layer TL, the nitrogen concentration is $7 \times 10^{20}$ atoms/m$^2$ or more in the position of 2 nm inside from the outer circumferential end of the columnar stack ST, and thus, it is possible to suppress a leak current that occurs in the vicinity of the interface between the columnar stack and the protective film. As described above, in the magnetic memory element, an improvement in the properties of the magnetic memory element, such as an improvement in the coercive properties or a reduction in the leak current, can be attained.

(5) Modification Example 1

In the first embodiment and Examples described above, a layer having a configuration in which the nitrogen concentration is $4 \times 10^{29}$ atoms/m$^2$ or less in the position of 13 nm inside from the outer circumferential end of the columnar stack ST may be the layer including the recording layer FR, or may be all of the barrier layer TL (the first non-magnetic layer 14), the recording layer FR (the second ferromagnetic layer 15, the non-magnetic coupling layer 16, and the third ferromagnetic layer 17), and the second non-magnetic layer 18, but is not limited thereto, and for example, in the recording layer FR (the second ferromagnetic layer 15, the non-magnetic coupling layer 16, and the third ferromagnetic layer 17), the nitrogen concentration may be $4 \times 10^{29}$ atoms/m$^2$ or less in the position of 13 nm inside from the outer circumferential end of the columnar stack ST. Alternatively, in one or both of the recording layer FR (the second ferromagnetic layer 15, the non-magnetic coupling layer 16, and the third ferromagnetic layer 17) and the barrier layer TL (the first non-magnetic layer 14), the nitrogen concentration may be $4 \times 10^{29}$ atoms/m$^2$ less in the position of 13 nm inside from the outer circumferential end of the columnar stack ST.

(6) Modification Example 2

In the first embodiment, Examples, and the second embodiment described above, a region of 2 nm inside from the outer circumferential end of the columnar stack is not particularly limited, and in one or both of the recording layer and the barrier layer, the nitrogen concentration may be $4 \times 10^{29}$ atoms/m$^2$ or less in the position of 13 nm inside from the outer circumferential end of the columnar stack. Accordingly, it is possible to suppress the introduction of nitrogen with respect to the recording layer FR or the barrier layer TL, to suppress a decrease in the coercive force, and to improve the coercive properties.

The invention is not limited to Examples described above, various modifications can be made within the scope of the invention described in the claims, and it is needless to say that the modifications are also included in the scope of the invention.

The invention claimed is:

1. A magnetic memory element, comprising:
    a columnar stack in which a reference layer having a fixed magnetization direction, a barrier layer including a non-magnetic body, and a recording layer having a reversible magnetization direction are stacked in this order; and
    an insulating film which contains nitrogen and is provided to cover a lateral surface of the columnar stack,
    wherein in one or both of the recording layer and the barrier layer, a nitrogen concentration is $4 \times 10^{29}$ atoms/m$^2$ or less in a position of 13 nm inside from an outer circumferential end of the columnar stack.

2. The magnetic memory element according to claim 1, wherein in one or both of the recording layer and the barrier layer, the nitrogen concentration is $7 \times 10^{30}$ atoms/m$^2$ or more in a position of 2 nm inside from the outer circumferential end of the columnar stack.

3. The magnetic memory element according to claim 1, wherein the columnar stack is in a shape of a truncated cone.

4. The magnetic memory element according to claim 1, wherein the columnar stack includes a non-magnetic layer provided on a surface of the recording layer on a side opposite to the barrier layer.

5. The magnetic memory element according to claim 4, wherein in the recording layer, the barrier layer, and the non-magnetic layer, the nitrogen concentration is $4\times10^{29}$ atoms/m$^2$ or less in a position of 13 nm inside from the outer circumferential end of the columnar stack.

6. The magnetic memory element according to claim 4, wherein in the recording layer, the barrier layer, and the non-magnetic layer, the nitrogen concentration is $7\times10^{30}$ atoms/m$^2$ or more in a position of 2 nm inside from the outer circumferential end of the columnar stack.

7. The magnetic memory element according to claim 1, wherein the recording layer is a multi-layer stack including a plurality of ferromagnetic layers and at least one non-magnetic coupling layer, in which the ferromagnetic layer and the non-magnetic coupling layer are alternately stacked.

8. The magnetic memory element according to claim 1, wherein the recording layer contains at least one type of Fe, Co, and Ni.

9. The magnetic memory element according to claim 1, wherein the barrier layer contains oxygen (O).

10. A magnetic memory, comprising:
the magnetic memory element according to claim 1;
a write unit writing data in the magnetic memory element by applying a write current to the magnetic memory element; and
a read unit reading the data written in the magnetic memory element by applying a read current that passes through the barrier layer, and by detecting the read current that has passed through the barrier layer.

11. A method for producing a magnetic memory element, comprising:
a step of forming a stack in which a reference layer having a fixed magnetization direction, a barrier layer including a non-magnetic body, and a recording layer having a reversible magnetization direction are stacked in this order;
a step of forming a columnar stack by processing the stack into a shape of a column; and
a step of forming an insulating film which contains nitrogen and covers a lateral surface of the columnar stack,
wherein in the step of forming the insulating film, the insulating film is formed such that in one or both of the recording layer and the barrier layer, a nitrogen concentration is $4\times10^{29}$ atoms/m$^2$ or less in a position of 13 nm inside from an outer circumferential end of the columnar stack.

12. The method for producing the magnetic memory element according to claim 11, wherein in the step of forming the insulating film, the insulating film is formed such that in one or both of the recording layer and the barrier layer, the nitrogen concentration is $7\times10^{30}$ atoms/m$^2$ or more in a position of 2 nm inside from the outer circumferential end of the columnar stack.

13. The method for producing the magnetic memory element according to claim 11, wherein in the step of forming the insulating film, the insulating film is formed such that the insulating film is formed by a plasma-enhanced chemical vapor deposition method in which a film formation temperature is 200° C. or lower.

14. A magnetic memory element, comprising:
a columnar stack in which a reference layer having a fixed magnetization direction, a barrier layer including a non-magnetic body, and a recording layer having a reversible magnetization direction are stacked in this order; and
an insulating film which contains nitrogen and is provided to cover a lateral surface of the columnar stack,
wherein in one or both of the recording layer and the barrier layer, a nitrogen concentration is $7\times10^{30}$ atoms/m$^2$ or more in a position of 2 nm inside from an outer circumferential end of the columnar stack.

15. A magnetic memory, comprising:
the magnetic memory element according to claim 14;
a write unit writing data in the magnetic memory element by applying a write current to the magnetic memory element; and
a read unit reading the data written in the magnetic memory element by applying a read current that passes through the barrier layer, and by detecting the read current that has passed through the barrier layer.

16. A method for producing a magnetic memory element, comprising:
a step of forming a stack in which a reference layer having a fixed magnetization direction, a barrier layer including a non-magnetic body, and a recording layer having a reversible magnetization direction are stacked in this order;
a step of forming a columnar stack by processing the stack into a shape of a column; and
a step of forming an insulating film which contains nitrogen and covers a lateral surface of the columnar stack,
wherein in the step of forming the insulating film, the insulating film is formed such that in one or both of the recording layer and the barrier layer, a nitrogen concentration is $7\times10^{30}$ atoms/m$^2$ or more in a position of 2 nm inside from an outer circumferential end of the columnar stack.

* * * * *